US010925200B2

(12) United States Patent
Iisaka et al.

(10) Patent No.: US 10,925,200 B2
(45) Date of Patent: Feb. 16, 2021

(54) MOUNTING PROCESSING METHOD, MOUNTING SYSTEM, EXCHANGE CONTROL DEVICE, AND COMPONENT MOUNTER

(71) Applicant: FUJI CORPORATION, Chiryu (JP)

(72) Inventors: Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 322 days.

(21) Appl. No.: 15/775,413

(22) PCT Filed: Nov. 17, 2015

(86) PCT No.: PCT/JP2015/082233
§ 371 (c)(1),
(2) Date: May 11, 2018

(87) PCT Pub. No.: WO2017/085782
PCT Pub. Date: May 26, 2017

(65) Prior Publication Data
US 2018/0376635 A1 Dec. 27, 2018

(51) Int. Cl.
*H05K 13/08* (2006.01)
*H05K 13/04* (2006.01)
(Continued)

(52) U.S. Cl.
CPC ....... *H05K 13/086* (2018.08); *H05K 13/0417* (2013.01); *H05K 13/0419* (2018.08);
(Continued)

(58) Field of Classification Search
CPC .......... H05K 13/0411; H05K 13/0409; H05K 13/0417; H05K 13/0419; H05K 13/0452;
(Continued)

(56) References Cited

U.S. PATENT DOCUMENTS 4,631,816 A * 12/1986 Fujita ................. H05K 13/0411
29/740
4,914,808 A * 4/1990 Okumura ........... H05K 13/0413
29/740
(Continued)

FOREIGN PATENT DOCUMENTS

EP 2 874 481 A1 5/2015
JP 9-214191 A 8/1997
(Continued)

OTHER PUBLICATIONS

Partial Supplementary European Search Report dated May 28, 2019 in corresponding European Patent Application No. 15908722.0, 19 pages.
(Continued)

*Primary Examiner* — Carl J Arbes
(74) *Attorney, Agent, or Firm* — Oblon, McClelland, Maier & Neustadt, L.L.P.

(57) ABSTRACT

A component mounting system starts mounting processing in a state in which a portion of the initial set target feeders of the multiple feeders required for mounting processing are set in supply area of component mounter, and in which remaining feeders are not set in supply area of component mounter. Mounting processing is performed while switching feeders that have finished supplying components with remaining feeders using exchange robot during mounting processing of a single board. By this, because it is possible to perform mounting processing while exchanging required feeders within the range of the upper limit loading quantity of component mounter, it is possible to improve the efficiency of mounting processing.

20 Claims, 25 Drawing Sheets

(51) Int. Cl.
*H01R 33/88* (2006.01)
*H01R 43/26* (2006.01)

(52) U.S. Cl.
CPC ..... *H05K 13/0452* (2013.01); *H05K 13/0495* (2013.01); *H05K 13/085* (2018.08); *H05K 13/087* (2018.08); *H05K 13/0853* (2018.08); *H05K 13/0882* (2018.08); *H01R 33/88* (2013.01); *H01R 43/26* (2013.01); *H05K 13/0409* (2018.08)

(58) Field of Classification Search
CPC ............. H05K 13/0495; H05K 13/085; H05K 13/0853; H05K 13/086; H05K 13/087; H05K 13/0882; H01R 33/88; H01R 43/28
See application file for complete search history.

(56) References Cited

U.S. PATENT DOCUMENTS

| | | | | |
|---|---|---|---|---|
| 4,999,909 | A * | 3/1991 | Eguchi | H05K 13/0417 29/740 |
| RE33,780 | E * | 12/1991 | Itagaki | B23Q 7/1426 29/741 |
| 5,319,846 | A * | 6/1994 | Takahashi | H05K 13/0452 29/740 |
| 5,456,001 | A | 10/1995 | Mori et al. | |
| 5,727,311 | A * | 3/1998 | Ida | H05K 13/021 29/832 |
| 6,058,599 | A * | 5/2000 | Hanamura | H05K 13/085 29/740 |
| 6,199,272 | B1 * | 3/2001 | Seto | H05K 13/021 29/740 |
| 6,629,007 | B1 * | 9/2003 | Hattori | H05K 13/086 700/100 |
| 6,877,220 | B1 * | 4/2005 | Kuribayashi | H05K 13/0417 29/832 |
| 8,151,448 | B2 * | 4/2012 | Vermeer | H05K 13/0434 156/349 |
| 8,549,999 | B2 * | 10/2013 | Mizuno | H05K 3/1216 101/114 |
| 10,004,168 | B2 * | 6/2018 | Mizuno | H05K 13/0417 |
| 10,477,746 | B2 * | 11/2019 | Kobayashi | H05K 13/021 |
| 2017/0061365 | A1 * | 3/2017 | Nonoyama | G05B 19/41835 |
| 2017/0303448 | A1 | 10/2017 | Iisaka et al. | |

FOREIGN PATENT DOCUMENTS

| | | |
|---|---|---|
| JP | 10-242689 A | 9/1998 |
| JP | 2007-115982 A | 5/2007 |
| JP | 2013-38282 A | 2/2013 |
| WO | WO 2015/037099 A1 | 3/2015 |
| WO | WO 2016/035145 A1 | 3/2016 |

OTHER PUBLICATIONS

International Search Report dated Feb. 16, 2016 in PCT/JP2015/082233 filed Nov. 17, 2015.

* cited by examiner (a) When mounting processing is started (b) During mounting processing (a) When mounting processing is started for first board type (b) When mounting processing is finished for first board type

MOUNTING PROCESSING METHOD, MOUNTING SYSTEM, EXCHANGE CONTROL DEVICE, AND COMPONENT MOUNTER

TECHNICAL FIELD

The present application relates to a mounting processing method, a mounting system, an exchange control device, and a component mounter.

BACKGROUND ART

Conventionally, component mounters that mount components, which are supplied by a component supply unit that houses multiple components, on a board are known. For example, with a component mounter of patent literature 1, multiple component supply units are arranged lined up along the conveyance direction of the board. With such a component mounter, when changing the type of board being produced, there are cases in which exchange work of component supply units is performed by an operator in accordance with the types of components required for mounting. In this case, the time required for exchange work depends on the quantity of component supply units to be exchanged, and there are cases in which the start of production of the next type of board is delayed.

CITATION LIST

Patent Literature

BRIEF SUMMARY

Technical Problem

To solve such a problem of exchange time, performing exchange of component supply units automatically has been proposed (for example, PCT/JP2014/73093). In a component mounting system disclosed therein an exchange robot capable of automatically exchanging component supply units is provided. And, the exchange robot enables changeover of board type to be performed quickly by exchanging a component supply unit for which supplying of components has been completed with a component supply unit required for the next mounting processing during production of the pre-changeover board type. As such, in order to improve mounting processing productivity, it is demanded to perform exchange of component supply units efficiently.

Here, exchange of component supply units is not limited to when the board type is changed. In particular, with an item used as a unit exchanging device such as an exchange robot, compared to an operator exchanging component supply units, it is possible to exchange component supply units in various situations, further increasing the above demand for efficient exchange.

An object of the present disclosure is to improve productivity by efficiently exchanging component supply units during mounting processing using a unit exchanging device.

Solution to Problem

The present disclosure uses the following means to achieve the above object.

A first mounting processing method of the present disclosure is a mounting processing method performed at a component mounter including: using the component mounter to perform mounting processing of mounting multiple types of components on a board, the multiple types of components being supplied from multiple component supply units configured to house multiple components and be exchangeably set by a unit exchanging device, wherein during mounting processing of one of the boards, from the multiple component supply units set on the component mounter, a component supply unit with remaining housed components is exchanged with a different component supply unit by the unit exchanging device. By this, it is possible to use a unit exchanging device to easily perform exchange of component supply units during mounting processing of one board to improve productivity of the mounting processing. Note that, a component supply unit being set on the component mounter means that the component supply unit is attached such that components can be supplied.

The first mounting processing method of the present disclosure may further include starting mounting processing in a state in which, from the multiple component supply units required for mounting processing, a portion of the multiple component supply units are set on the component mounter and a remaining portion of the component supply units are not set on the component mounter, and during mounting processing of one of the boards, performing mounting processing while exchanging the component supply unit that has completed supplying the components during the mounting processing from among the portion of component supply units set on the component mounter with one of the component supply units of the remaining portion. Accordingly, mounting processing can be performed with a limited quantity of set component supply units while exchanging the required component supply units, thus improving mounting processing productivity. Note that, a "component supply unit that has completed supplying the components during the mounting processing" refers to a component supply unit that does not need to supply any more components with respect to the one board during the mounting processing.

The first mounting processing method of the present disclosure may further include: performing mounting processing by using a head to pick up the component supplied by the component supply unit and then moving the head above the board via a specified position, and during the mounting processing, from among the component supply units that have completed supplying the components, taking as a target for exchange the component supply unit set at a position for which a moving distance for the head from picking up the component to moving to the specified position is shorter than another component supply unit, and using the unit exchanging device to perform exchange of the target component supply unit with one of the component supply units of the remaining portion. Accordingly, by exchanging component supply units during mounting processing, it is possible to reduce the moving time of the head to the specified position, thus improving productivity further. Note that, the remaining component supply units may be set such that the reduction effect of the time required to move the head to the specified position is larger than the time required to exchange the component supply units, based on the quantity (supply quantity) of a component type to be used for mounting processing on one board. For example, among the multiple component supply units required for mounting processing, component supply units with a large supply quantity may be set as the remaining component supply units. Accordingly, by setting the remaining component supply unit at a position for which a moving distance for the head to the specified position is shorter than another component supply unit, it is possible to increase the effect of improving the productivity of the mounting processing.

The first mounting processing method of the present disclosure may further include: during mounting processing of one of the boards, from among the component supply units set on the component mounter, using the unit exchanging device to change an arrangement of the component supply units that have completed supplying the components during the mounting processing, and the component supply units that have not completed supplying the components during the mounting processing. Accordingly, it is possible to perform mounting processing while setting component supply units at positions more efficient for supply.

The first mounting processing method of the present disclosure may further include: performing mounting processing by using a head to pick up the component supplied by the component supply unit and then moving the head above the board via a specified position, and during the mounting processing, from among the component supply units that have completed supplying the components, taking as a target for exchange the component supply unit set at a position for which a moving distance for the head from picking up the component to moving to the specified position is shorter than another component supply unit, and using the unit exchanging device to change an arrangement of the component supply units that have not completed supplying the components during the mounting processing. Accordingly, the head moving time can be reduced, further improving productivity. Note that, a component supply unit used as a target for arrangement changing may be a component supply unit set at the position for which the moving distance of the head from picking up the component to the specified position is the shortest. Accordingly, the effect of reducing the head moving time is increased, further improving productivity. Also, when comparing the arrangement changing time required to change the arrangement of component supply units and the movement reduction time that is the reduction in movement time of the head after the arrangement of the component supply units has been changed, if the movement reduction time exceeds the arrangement changing time, the arrangement of the component supply units is changed. Further, it is possible to set the component supply unit used as a target for change such that changing the arrangement of the component supply units is completed by the time supply should be started from the component supply unit used as the target for changing the arrangement.

A second mounting processing method of the present disclosure includes: using the component mounter to perform mounting processing of mounting multiple types of components on a board, the multiple types of components being supplied from multiple component supply units configured to house multiple components and be exchangeably set by a unit exchanging device, wherein consecutive mounting processing is performed by the component mounters on the boards that are conveyed in multiple lanes provided in parallel, and in a case in which a first type of the board on which mounting processing is being performed at a first lane among the multiple lanes, and another type of the board for which mounting processing is to be performed next at another of the lanes, are different, while continuing the mounting processing of the board of the same type at the first lane, performing exchange of the component supply unit that has finished supplying the components during the mounting processing of a single one of the board of the first board type with the component supply unit required for the next mounting processing at the other lane. Accordingly, when different types of boards are conveyed in multiple lanes, it is possible to perform mounting processing even if the quantity of component supply units required for the mounting processing of each of the board types exceeds the quantity that can be set on the component mounter. Note that, it is determined whether a component supply unit that has completed supplying the components during the mounting processing is to be used in the next mounting processing in another lane, and if it is determined that it is not to be used in the next mounting processing at the other lane, that component supply unit is exchanged with a component supply unit required in the next mounting processing at the other lane.

A third mounting processing method of the present disclosure includes: using the component mounter to perform mounting processing of mounting multiple types of components on a board, the multiple types of components being supplied from multiple component supply units configured to house multiple components and be exchangeably set by a unit exchanging device, further including performing mounting processing at the component mounters multiple of which are arranged along a conveyance direction of the board, and while continuing the mounting processing of the board of the same type, using the unit exchanging device to transfer the component supply unit set on one of the multiple component mounters to another of the component mounters. Accordingly, because a component supply unit can be used across each component mounter, it is possible to perform mounting processing efficiently, even in cases such as when the quantity of component supply units prepared is not the same as the quantity of component mounters.

In the third mounting processing method of the present disclosure, when a component-run-out occurs at the component supply unit of one type of the components during mounting processing, in a case in which a required quantity of that component type required to complete mounting processing of the same type of the board is less than a total remaining quantity of components housed in other component supply units of the same component type that are set on the multiple component mounters, the component supply unit for which that component type has not run out may be transferred by the unit exchanging device between the component mounters. Accordingly, when a component supply unit runs out of components, mounting processing can be continued without using a new component supply unit. Therefore, the occurrence of half-used component supply units can be curtailed.

In the third mounting processing method of the present disclosure, during mounting processing of boards of the same type, in a case in which there is a component type that should be supplied from the same single component supply unit, the single component supply unit of that component type may be transferred between component mounters by the unit exchanging device. Accordingly, in a case in which there is a component type that should be supplied from the same component supply unit as the component supply source, it is possible to perform mounting processing while efficiently transferring component supply units. Note that, when starting mounting processing of one board, in a case in which component supply units that are targets for transfer between each component mounter are set, mounting processing may be performed changing the mounting order such that priority is given to a component supplied from a component supply unit that is a target for transfer over another component supply unit that is not a target for transfer. Also, when starting mounting processing of one board, in a case in which component supply units that are targets for transfer between each component mounter are not set, mounting processing may be performed changing the mounting order such that priority is given to another component supply unit that is not a target for transfer over the component supply unit that is a target for transfer.

A first mounting system of the present disclosure includes: a component mounter configured to perform mounting processing of mounting components on a board, the components being supplied from multiple component supply units that house multiple of the components; a unit exchanging device configured to exchange the component supply units that are set on the component mounter; and an exchange control device configured to control the unit exchanging device, wherein the exchange control device is configured to, when the mounting processing is started in a state in which a portion of the multiple component supply units are set from the multiple component supply units required for mounting processing of one of the boards, during mounting processing of the one board, based on a mounting order of multiple types of the components during the mounting processing and information of the component supply units that have completed supplying component for the mounting processing, perform control such that the unit exchanging device exchanges the component supply unit that has completed supplying the components with a remaining component supply unit from among the component supply units required for the mounting processing excluding the portion of the component supply units that are already set. Accordingly, mounting processing can be performed with a limited quantity of set component supply units while exchanging the required component supply units, thus improving mounting processing productivity. Also, it is possible to curtail increasing the size of the component mounter to increase the quantity of component supply units that can be set.

A second mounting system of the present disclosure includes: a component mounter configured to perform mounting processing of mounting components on a board, the components being supplied from multiple component supply units that house multiple of the components; a unit exchanging device configured to exchange the component supply units that are set on the component mounter; and an exchange control device configured to control the unit exchanging device, wherein the exchange control device is configured to, during mounting of one of the boards, based on a mounting order of multiple types of the components during the mounting processing and information of the component supply units that have completed supplying component for the mounting processing, perform control such that the unit exchanging device changes an arrangement of the component supply units that have completed supplying the components during the mounting processing, and the component supply units that have not completed supplying the components during the mounting processing. Accordingly, it is possible to perform mounting processing while setting component supply units at positions more efficient for supply. A third mounting system of the present disclosure includes: a component mounter configured to perform mounting processing of mounting components on a board, the components being supplied from multiple component supply units that house multiple of the components; a unit exchanging device configured to exchange the component supply units that are set on the component mounter; and an exchange control device configured to control the unit exchanging device, wherein the component mounter performs consecutive mounting processing on the boards that are conveyed in multiple lanes provided in parallel, and the exchange control device is configured to, in a case in which a first type of the board on which mounting processing is being performed at a first lane among the multiple lanes, and another type of the board for which mounting processing is to be performed next at another of the lanes, are different, while continuing the mounting processing of the board of the same type at the first lane, based on a mounting order of multiple types of the components at the first lane and the other lane and information of the component supply units that have completed supplying component for the mounting processing, perform control such that the unit exchanging device exchanges the component supply unit that has completed supplying the components with the component supply unit required for the next mounting processing in the other lane. Accordingly, when different types of boards are conveyed in multiple lanes, it is possible to perform mounting processing even if the quantity of component supply units required for the mounting processing of each of the board types exceeds the quantity that can be set on the component mounter.

A fourth mounting system of the present disclosure includes: a component mounter configured to perform mounting processing of mounting components on a board, the components being supplied from multiple component supply units that house multiple of the components; a unit exchanging device configured to exchange the component supply units that are set on the component mounter; and an exchange control device configured to control the unit exchanging device, wherein multiple of the component mounters are arranged lined up in a conveyance direction of the board, and the exchange control device is configured to perform control such that, while continuing mounting processing of the same type of the board, based on information of the component supply units that have completed supplying the components during the mounting processing of one board of the same board type at the multiple component mounters, the unit exchanging device transfers the component supply units set on the multiple component mounters between the component mounters. Accordingly, because a component supply unit can be used across each component mounter, it is possible to perform mounting processing efficiently, even in cases such as when the quantity of component supply units prepared is not the same as the quantity of component mounters.

An exchange control device of the present disclosure is for performing control of a unit exchanging device that exchanges component supply units housing multiple components on a component mounter that performs mounting processing of mounting multiple types of the components supplied by multiple of the component supply units, the exchange control device including: an information acquiring section configured to acquire various information including a mounting order of the multiple types of components during mounting processing and information of component supply units that have completed supplying the components during the mounting processing, and an instruction output section configured to output an instruction to the unit exchanging device to exchange, from among the multiple component supply units set on the component mounter, the component supply unit that has completed supplying the components with a different one of the component supply units later in the mounting order than the component supply unit that has completed supplying the components, based on the mounting order of the multiple types of the components and the information of the component supply units that have completed supplying the components. Accordingly, because it is possible to use the unit exchanging device to exchange a component supply unit that has completed supplying components with a different component supply unit, it is possible to use a unit exchanging device to easily perform exchange of component supply units during mounting processing of one board to improve productivity of the mounting processing.

In an exchange control device of the present disclosure, the information acquiring section may be configured to acquire information of a required unit quantity of the multiple component supply units that are required for mounting processing of one of the boards, further included may be a unit quantity determining section configured to determine whether the required unit quantity exceeds a maximum unit quantity indicating how many units can be set on the component mounter, and a set contents deciding section configured to decide setting contents of the component supply unit before being set on the component mounter in a case in which the unit quantity determining section determines that the required unit quantity exceeds the maximum unit quantity, and wherein the setting contents deciding section, based on the mounting order, may be configured to decide, from among the multiple component supply units required for mounting processing of one of the boards, a portion of the component supply units that should be set on the component mounter when the mounting processing is started, and to decide a setting order of the remaining component supply units excluding the portion of the component supply units that should be set when mounting processing is started, and the instruction output section may be configured to, before mounting processing of the one of the boards is started, output an instruction to the unit exchanging device to set the portion of the component supply units on the component mounter, and during the mounting processing, to exchange the component supply unit that has completed supplying the components during the mounting processing with the component supply unit that should be set next based on the setting order. Accordingly, mounting processing can be performed with a limited quantity of set component supply units while exchanging the required component supply units, thus improving mounting processing productivity.

In an exchange control device of the present disclosure, the unit exchanging device may be configured to perform exchange of the component supply units on the component mounter that performs mounting processing on the boards that are conveyed in multiple lanes provided in parallel, the information acquiring section may acquire information of the type of each of the panels on which mounting processing is to be performed in the multiple lanes, and further included may be a board type determining section configured to determine whether, in a case in which switching is performed from mounting processing of a first one of the lanes among the multiple lanes to mounting processing of another of the lanes, the type of the board in the first one of the lanes and the type of the board in the other of the lanes are different, and the instruction output section may be configured to, in a case in which the board type determining section determines that the type of the board in the first one of the lanes and the type of the board in the other of the lanes are different, during mounting processing of the board in the first one of the lanes, exchange the component supply unit that has finished supplying the components during the mounting processing of the one of the boards of the same board type with the component supply unit required for the next mounting processing in the other lane. Accordingly, when different types of boards are conveyed in multiple lanes, it is possible to perform mounting processing even if the quantity of component supply units required for the mounting processing of each of the board types exceeds the quantity that can be set on the component mounter.

In exchange control device of the present disclosure, the unit exchanging device may be configured to exchange the component supply devices at multiple of the component mounters arranged lined up in a conveyance direction of the board, the information acquiring section may be configured to, when a component-run-out occurs at the component supply unit of one type of the components during mounting processing, acquire a required component quantity that is a required quantity of the component type until mounting processing of the same type of the board is complete, and a remaining component quantity that is a quantity of remaining components housed in different component supply units of the same component type that are set on the multiple component mounters, further included may be a component quantity determining section configured to determine whether the remaining component quantity is larger than the required component quantity, and wherein the instruction output section may be configured to, in a case in which the component quantity determining section determines that the remaining component quantity is larger than the required component quantity, output instructions to the unit exchanging device so as to exchange the component supply unit for which components have run out with the different component supply unit of the same component type that has not run out of components. Accordingly, when a component supply unit runs out of components, mounting processing can be continued without using a new component supply unit. Therefore, the occurrence of half-used component supply units can be curtailed.

An exchange control device of the present disclosure may further include a supply source determining section configured to determine whether there is a component type for which a supply source of the component should be the same component supply unit during mounting processing of the same type of the board, wherein the instruction output section is configured to, in a case in which the supply source determining section determines that there is a component type for which a supply source of the component should be the same component supply unit during mounting processing of the same type of the board, when supplying of components is completed from one component supply unit of the component type at the component mounter, output an instruction to the unit changing device so as to remove the one component supply unit from the component mounter and set the one component supply unit on a different one of the component mounters. Accordingly, in a case in which there is a component type that should be supplied from the same component supply unit as the component supply source, it is possible to perform mounting processing while efficiently transferring component supply units.

With an exchange control device of the present disclosure, the unit exchanging device may be configured to exchange the component supply units at the component mounter that performs mounting processing by using a head to pick up a component supplied by a component supply device, and then moving the head above the board via a specified position, and the information acquiring section may be configured to, based on a first set position at which the component supply units that are to be determined are set, and a second set position closer to the specified position than the first set position, acquire a movement reduction time that is a difference between a moving time of the head from the component supply position at the component supply unit positioned at the first set position and a moving time of the head from the component supply position at the component supply unit positioned at the second set position, and an arrangement changing time that is a time required to change an arrangement of the component supply unit, further included may be an arrangement changing determining section configured to determine whether to change the arrangement of the component supply units that were targets for the determining, based on the mounting order, the reduction time, and the arrangement changing time, and wherein the instruction output section may be configured to, in a case in which the arrangement changing determining section determines to change the arrangement, output instructions to the unit exchanging device such that when supplying of the components by the component supply units set at the second set position is completed, the arrangement of the component supply unit for which supplying of the components is completed and the component supply unit set at the first set position is changed. Accordingly, in a case in which the head movement reduction time is greater than the component supply unit arrangement changing time, because the arrangement of the component supply units can be changed, it is possible to curtail any loss due to arrangement changes and to further improve productivity.

A first component mounter of the present disclosure is configured to perform mounting processing of multiple types of components supplied from multiple component supply units configured to house multiple components and be exchangeably set by a unit exchanging device, the component mounter being further configured to send an exchange request to the unit exchanging device to perform exchange of the component supply unit that has completed supplying the components with the component supply unit that has not completed supplying the components, based on a mounting order of the multiple components during the mounting processing, and information of the component supply unit that has completed supplying the components during the mounting processing. By this, it is possible to use a unit exchanging device to easily perform exchange of component supply units during mounting processing of one board to improve productivity of the mounting processing.

A second component mounter of the present disclosure is configured to perform mounting processing of multiple types of components supplied from multiple component supply units configured to house multiple components and be exchangeably set by a unit exchanging device, the component mounter being further configured to send an exchange request to the unit exchanging device to perform exchange of the component supply unit that has completed supplying the components with the component supply unit required for a next mounting processing in another lane, based on a type of the boards on which mounting processing is to be performed at multiple lanes, a mounting order of the multiple components during the mounting processing for each type of the boards, and information of the component supply unit that has completed supplying the components during the mounting processing at one of the lanes among the multiple lanes. Accordingly, it is possible to curtail any exchange loss of component supply units during changeover of the board type in each lane, thus it is possible to improve productivity of mounting processing.

DESCRIPTION OF EMBODIMENTS

First Embodiment

Figure 1:
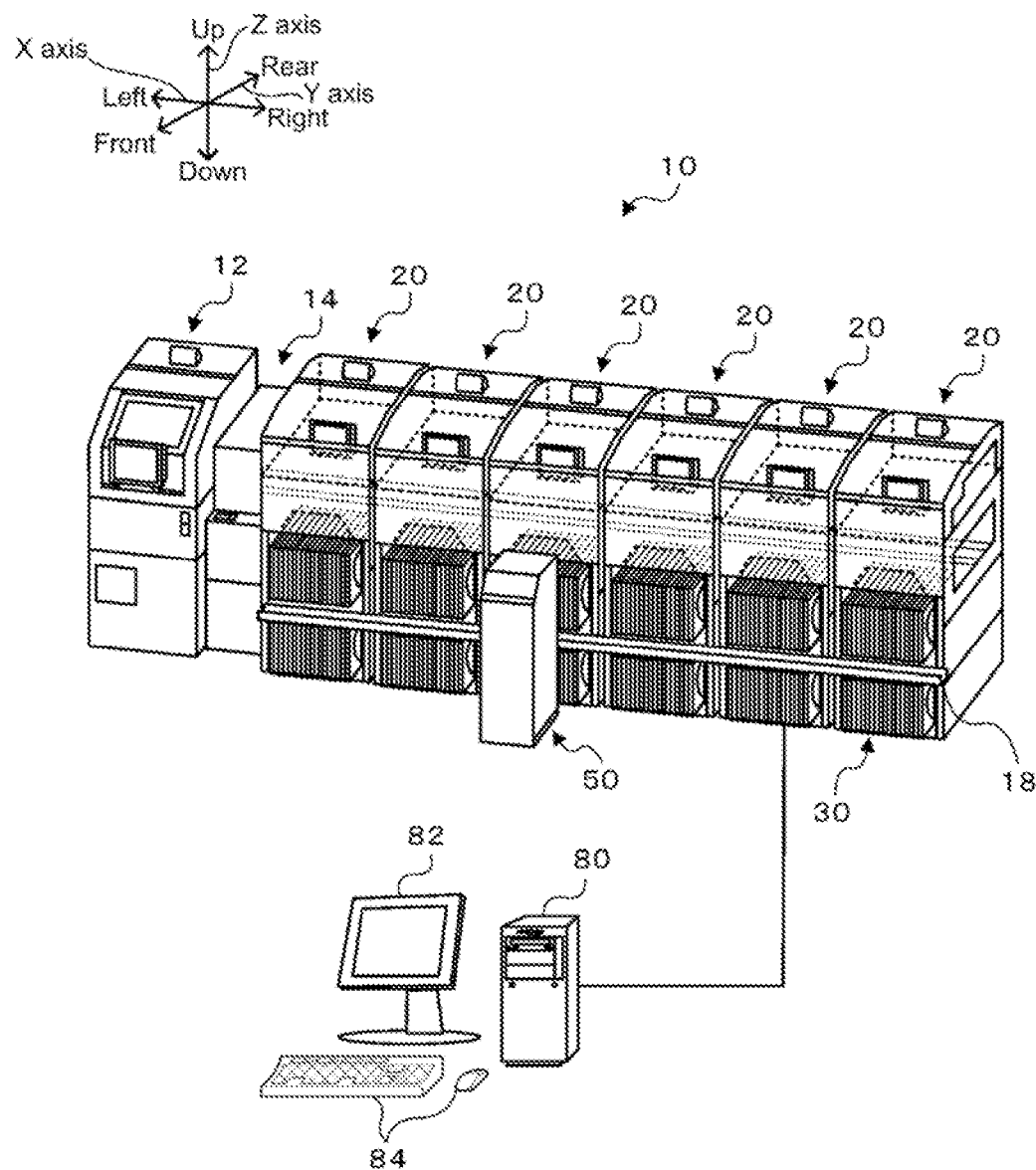
FIG. 1 shows the overall configuration of component mounting system 10.
Figure 2:
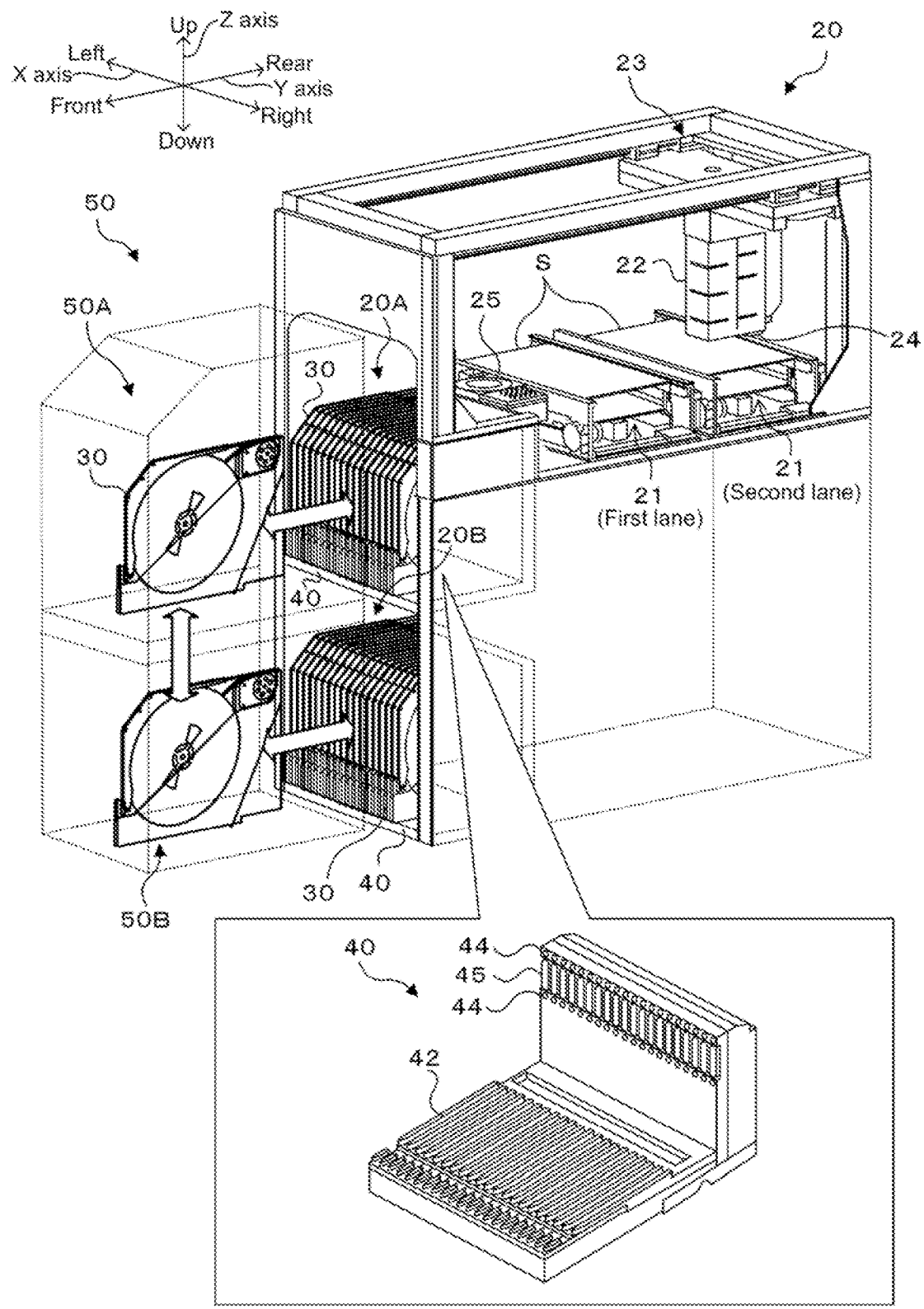
FIG. 2 shows the overall configuration of component mounter 20.
Figure 3:
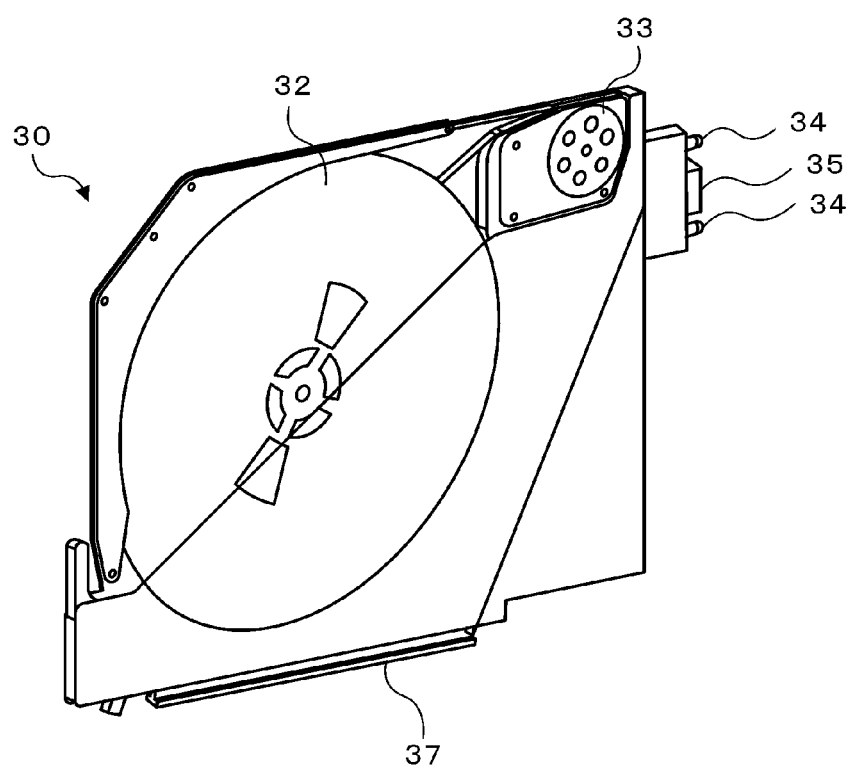
FIG. 3 shows the overall configuration of feeder 30.
Figure 4:
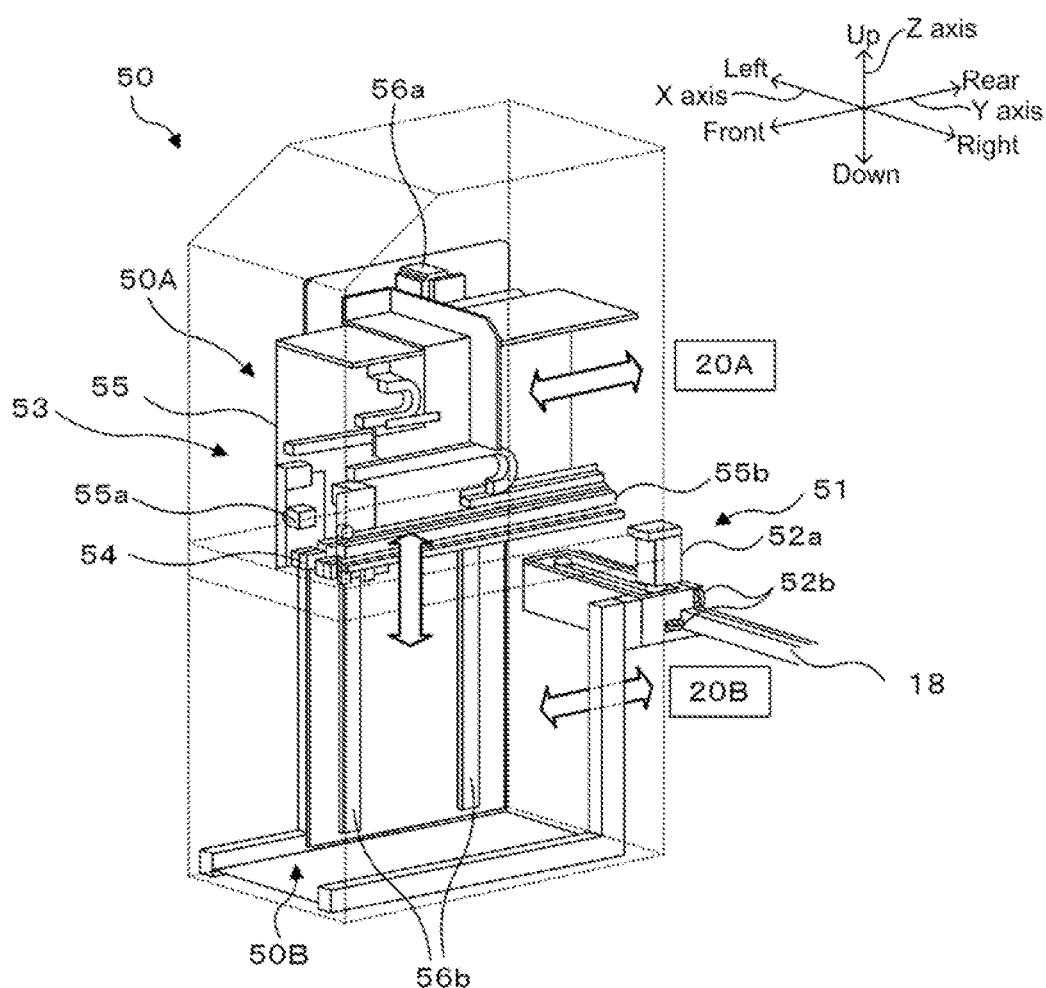
FIG. 4 shows the overall configuration of exchange robot 50.
Figure 5:
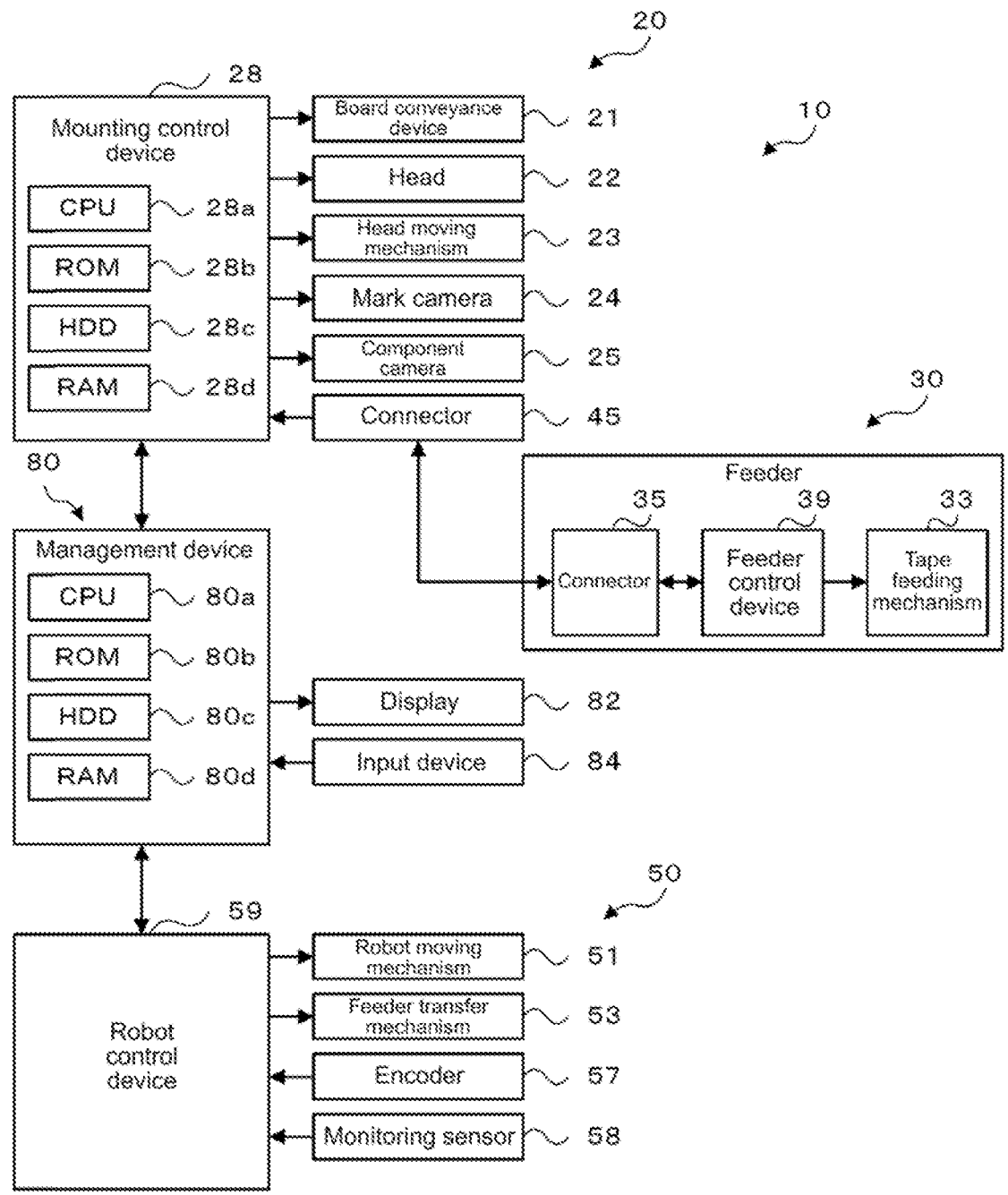
FIG. 5 shows the configuration of control related items of component mounting system 10.

A first embodiment of the present disclosure is described below using the figures. FIG. 1 shows the overall configuration of component mounting system 10; FIG. 2 shows the overall configuration of component mounter 20; FIG. 3 shows the overall configuration of feeder 30. FIG. 4 shows the overall configuration of exchange robot 50; FIG. 5 shows the configuration of control related items of component mounting system 10. Note that, the left-right direction in FIG. 1 is the X direction, the front-rear direction is the Y direction, and the up-down direction is the Z direction.

As shown in FIG. 1, component mounting system 10 is provided with items such as printer 12 that prints solder on a board, print inspection machine 14 that inspects the state of printed solder, multiple component mounters 20 that mount components supplied from feeders 30 on a board, a mounting inspection machine (not shown) that inspects the mounting state of the components, and management device 80 that manages the line overall. With component mounting system 10, printer 12, print inspection machine 14, and the multiple component mounters 20 are arranged lined up in order in the conveyance direction (X direction) of the board.

Further, component mounting system 10 is provided with exchange robot 50 that performs automatic exchange of feeders 30 between each of the component mounters 20. Exchange robot 50 is able to move along X-axis rail 18 that is provided on the front of the multiple component mounters 20 parallel to the conveyance direction (X direction) of the board. Note that, in FIG. 2, X-axis rail 18 is not shown.

As shown in FIG. 2, component mounter 20 is provided with board conveyance device 21 capable of conveying board S, head 22 including a suction nozzle that picks up a component supplied by feeder 30, head moving mechanism 23 that moves head 22 in the XY directions, and mounting control device 28 (refer to FIG. 5) that controls the apparatus overall. Further, component mounter 20 is provided with mark camera 24 that images from above a mark provided on board S, and component camera 25 that images from below a component held by the suction nozzle. Component mounter 20 includes two lanes (for example, a first lane at a front side in the Y direction, and a second lane at a rear side in the Y direction). Board conveyance device 21 is able to convey boards S in each lane. Mounting control device 28 is configured from CPU 28a, ROM 28b, HDD 28c, RAM 28d, and the like. Mounting control device 28 outputs drive signals to board conveyance device 21, head 22, head moving mechanism 23, feeders 30 and the like, outputs imaging instructions to mark camera 24 and component camera 25, and receives captured images from mark camera 24 and component camera 25.

Feeder 30 is configured as a tape feeder that feeds tape housing components at a specified pitch. As shown in FIG. 3, feeder 30 is provided with tape reel 32 on which tape is wound, tape feeding mechanism 33 that pulls tape from tape reel 32, connector 35 including two positioning pins 34 that protrude, rail member 37 provided on a lower end, and feeder control device 39 (refer to FIG. 5) that performs control of the overall feeder. Feeder control device 39 is configured from a CPU, ROM, RAM and the like, and outputs drive signals to tape feeding mechanism 33. Also, feeder control device 39 can communicate with mounting control device 28 of component mounter 20 to which feeder 30 is attached via connector 35.

As shown FIG. 2, component mounter 20 includes two areas, an upper and a lower area, to which feeders 30 can be attached at the front. The upper area is supply area (component supply area) 20A at which feeders 30 can supply components, and the lower area is stock area 20B at which feeders 30 can be stocked. Feeder table 40 on which multiple feeders 30 are loaded (set) is provided in supply area 20A and in stock area 20B. Feeder table 40 is a table with an L shape as viewed from the side, and is provided with multiple slots 42 lined up the X direction such that rail member 37 of feeder 30 can be inserted, two positioning holes 44 into which two positioning pins 34 of feeder 30 can be inserted, and connector 45 that connects to connector 35 provided between the two positioning holes 44. Note that, each feeder table 40 has a maximum loading quantity of N feeders 30.

Figure 6:
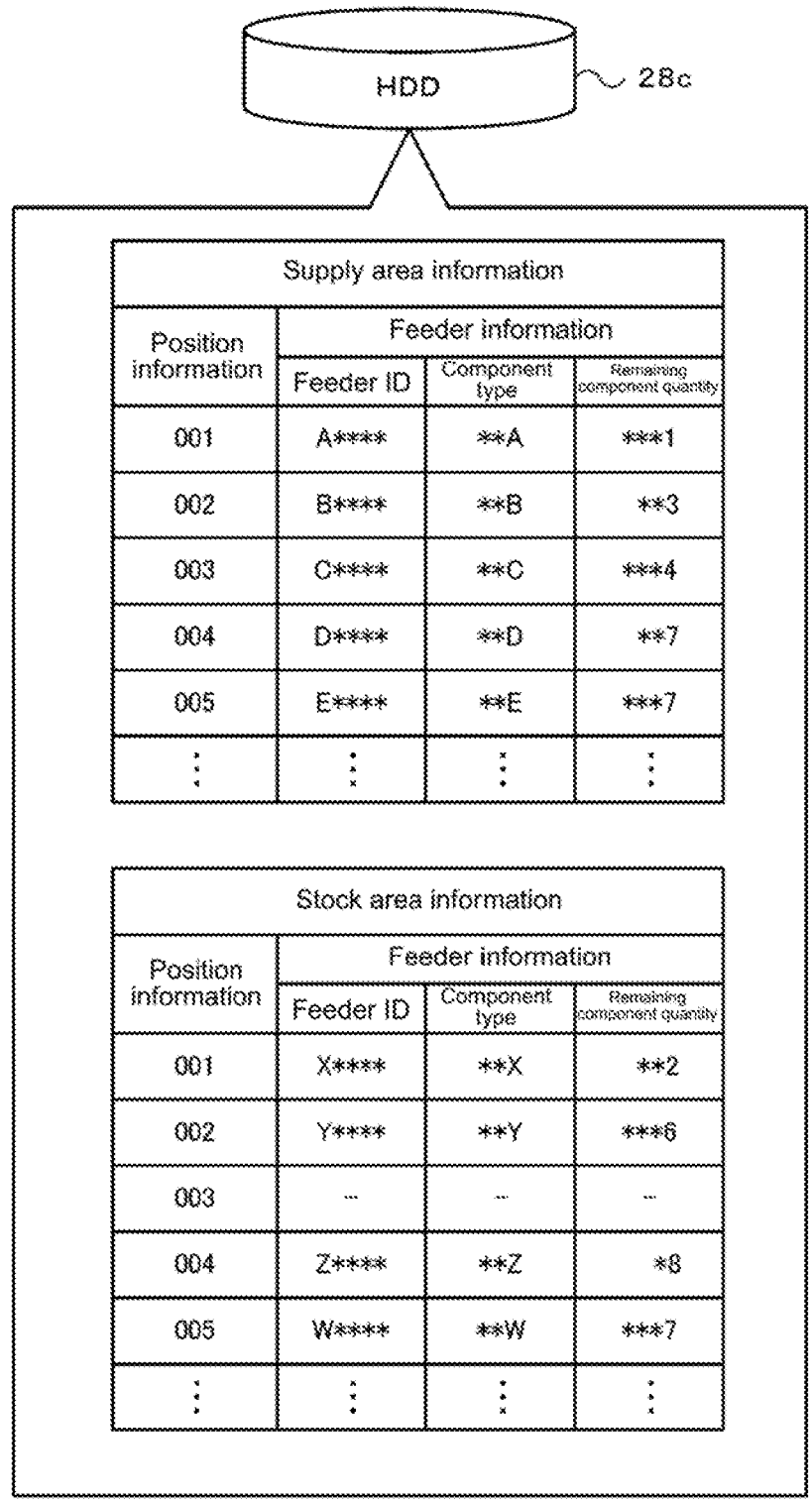
FIG. 6 shows an example of supply area information and stock area information.

Here, FIG. 6 illustrates an example of supply area information and stock area information stored on HDD 28c. Supply area information is information of feeders 30 set in supply area 20A. Stock area information is information of feeders 30 set in stock area 20B. The supply area information stores feeder 30 ID information, information of the component type housed in the feeder 30, remaining component quantity information, and the like linked to position information that is the attachment position of feeder 30 in supply area 20A. Note that, position information is defined in order with "001" being the leading position reference slot (for example, the left-most slot 42) of the multiple slots 42 on feeder table 40. Also, feeder 30 ID information, component type information, remaining component quantity information, is acquired from feeder control device 39 of feeder 30 via connectors 35 and 45. Similarly, stock area information stores feeder 30 ID information, information of the component type housed in the feeder 30, component type information, remaining component quantity information, and the like linked to position information that is the attachment position of feeder 30 in stock area 20B. Therefore, supply area information and stock area information are updated appropriately when a feeder 30 is attached or removed and when a component is supplied during component mounting processing. Note that, position information of the stock area information indicates that a feeder 30 is not attached at position "003".

As shown in FIG. 4, exchange robot 50 is provided with robot moving mechanism 51 that moves exchange robot 50 along X-axis rail 18, feeder transfer mechanism that transfers feeder 30 to and from component mounter 20, and robot control device 59 (refer to FIG. 5) that controls the exchange robot overall. Robot moving mechanism 51 is provided with X-axis motor 52a such as a servo motor that drives a drive belt for moving exchange robot 50, guide rollers 52b that guide movement of exchange robot 50 along X-axis rail 18, and the like. Feeder transfer mechanism 53 is provided with Y-axis slider 55 on which is loaded clamp section 54 that clamps feeder 30 and Y-axis motor 55a that moves clamp section 54 along Y-axis guide rail 55b, and Z-axis motor 56a that moves Y-axis slider 55 along Z-axis guide rail 56b. Exchange robot 50 is also provided with encoder 57 (refer to FIG. 5) that detects the movement position in the X direction, monitoring sensor 58 (refer to FIG. 5) such as an infrared sensor that monitors the presence of an obstacle (operator) to the left and right of exchange robot 50, and the like.

Y-axis slider 55 of feeder transfer mechanism 53, by the driving of Z-axis motor 56a, moves to upper section transfer area 50A that faces supply area 20A of component mounter 20 and moves to lower section transfer area 50B that faces stock area 20B of component mounter 20. Robot control device 59 moves Y-axis slider 55 that is clamping a feeder 30 using clamp section 54 from upper area transfer area 50A to supply area 20A by the driving of Y-axis motor 55a and inserts rail member 37 of the feeder 30 into a slot 42 of feeder table 40. Continuing, robot control device 59 attaches the feeder 30 to feeder table 40 of supply area 20A by releasing the clamp of clamp section 54. Also, robot control device 59 clamps a feeder 30 attached to feeder table 40 of supply area 20A using clamp section 54, and removes the feeder 30 from feeder table 40 of supply area 20A (pulls the feeder 30 into upper section transfer area 50A) by moving Y-axis slider 55 from supply area 20A to upper section transfer area 50A by the driving of Y-axis motor 55a. Robot control device 59 attaches a feeder 30 to feeder table 40 of stock area 20B and removes a feeder 30 from feeder table 40 of stock area 20B by moving Y-axis slider 55 to lower section transfer area 50B using Z-axis motor 56a and then performing similar processing except in lower section transfer area 50B instead of upper section transfer area 50A, therefore, descriptions are omitted.

As shown in FIG. 5, management device 80 is configured from items such as CPU 80a, ROM 80b, HDD 80c, and RAM 80d, and is provided with display 82 such as an LCD and input device 84 such as a keyboard and mouse. Management device 80 stores production programs (job data) of board S and the like. A production program of board S is a program that determines how many of and which components to mount on each type of board S (board type), from which component type to start mounting from (mounting order of component types), how many boards S of each board type to convey in each lane, and how many of each board type to produce (mount). Management device 80 is connected to mounting control device 28 via a wire such that communication is possible, is connected to robot control device 59 wirelessly such that communication is possible, and is connected to the control devices of printer 12, print inspection machine 14, and the mounting inspection machine such that communication is possible. Management device 80 sends a production program of board S to mounting control device 28, receives information related to the mounting state of component mounter 20 from mounting control device 28 and information related to the loading state of feeders 30, and receives information regarding the drive state of exchange robot 50 from robot control device 59. For example, management device 80 acquires supply area information and stock area information of each component mounter 20 as necessary via communication from mounting control device 28 of each component mounter 20.

Described below is processing of component mounting system 10 configured as above. First, processing performed by management device 80 is described. Note that, below, mainly described is processing for setting feeders 30 in supply area 20A required for component mounting processing. To aid descriptions, feeders 30 required for component mounting processing are taken to be set in either supply area 20A or stock area 20B. Note that, management device 80, in a case in which the feeders 30 required for component mounting processing are not set in either supply area 20A or stock area 20B, may indicate that fact to an operator and give a prompt to set the required feeders 30, or may move exchange robot 50 to a storage location of feeders 30, which is not shown, remove the required feeders 30 and deliver them.

Figure 7:
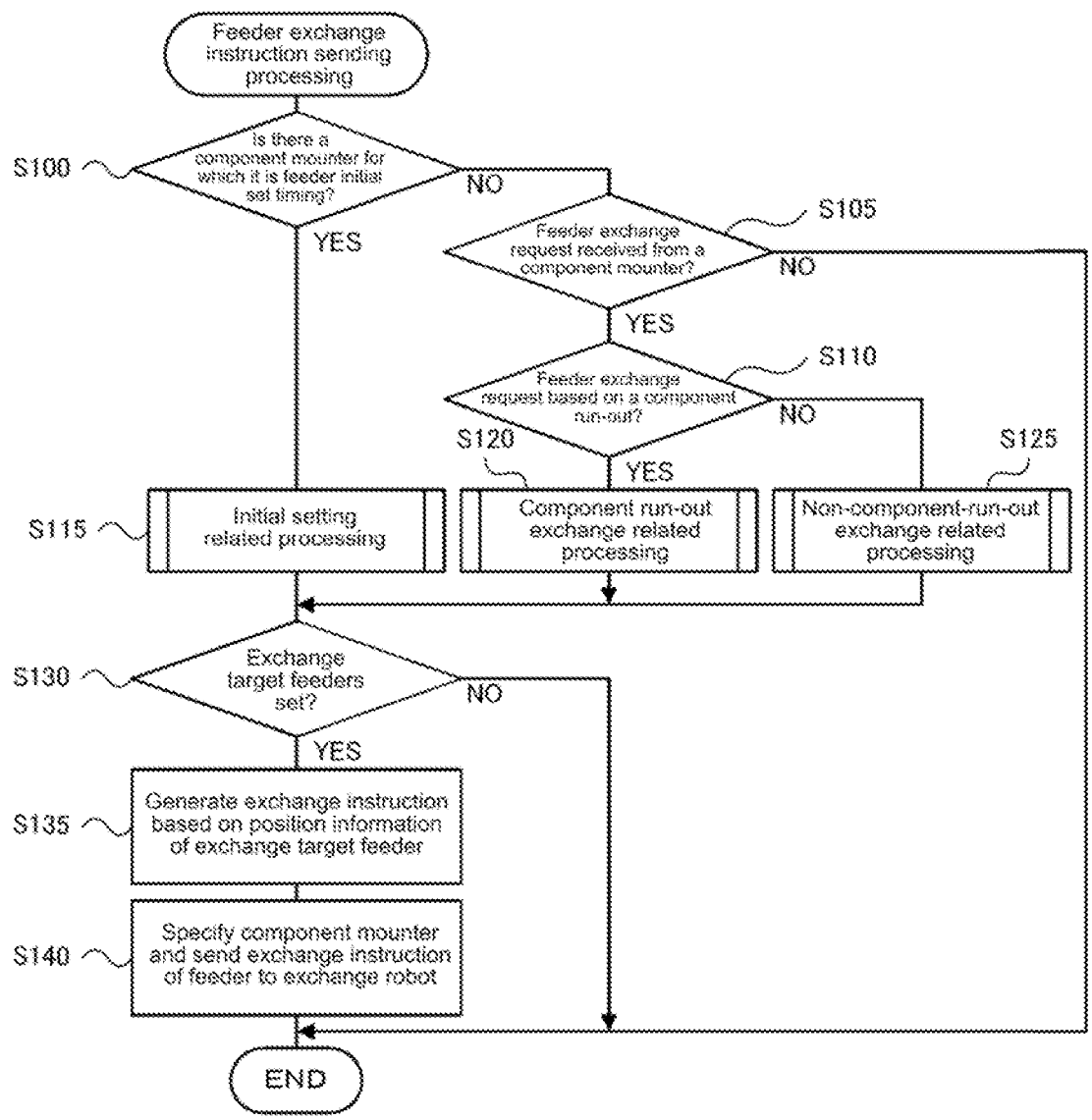
FIG. 7 is a flowchart showing an example of feeder exchange instruction sending processing.

FIG. 7 is a flowchart showing an example of feeder exchange instruction sending processing. This processing is performed every a predetermined amount of time. In processing of FIG. 7, CPU 80a of management device 80 determines respectively whether there is a component mounter 20 for which it is feeder initial set timing (S100), and whether a feeder exchange request has been received from any of the component mounters 20 (S105). Also, CPU 80a, upon determining that a feeder exchange request has been received, further determines whether there is a feeder exchange request based on a component-run-out (S110). Feeder initial set timing is the timing to set feeders 30 required to start mounting processing in supply area 20A using exchange robot 50, after an operator has performed changeover work and the like of switching various production materials (for example, suction nozzles, or head 22) of component mounter 20 according to the board type. Also, a feeder exchange request is a request sent from each component mounter 20 sent when remaining components run out at a feeder 30 set in supply area 20A during production processing, and when it is required to exchange a feeder 30 between supply area 20A and stock area 20B. CPU 80a, when determining in S100 that there is no component mounter 20 for which feeder initial set timing applies, and determining in S105 that a feeder exchange request has not been sent from any of the component mounters 20, ends processing.

On the other hand, CPU 80a of management device 80, when determining in S100 that there is a component mounter 20 for which feeder initial set timing applies, performs initial setting related processing (S115) with respect to component mounter 20. CPU 80a, when determining that a feeder exchange request has been received from component mounter 20 and that there is a feeder exchange request based on a component running out, performs exchange related processing for a component running out (S120). Further, CPU 80a, when determining that a feeder exchange request has been received from component mounter 20 and that it is not a feeder exchange request based on a component-run-out, performs exchange related processing for a non-component-run-out (S125). Then, CPU 80a determines whether the exchange target feeders 30 of each of the related processing of S115, S120, and S125 have been set (S130). CPU 80a, when determining that exchange is not required in each related processing, or that exchange is on standby, or that exchange target feeders 30 have not been set, ends processing. On the other hand, CPU 80a, if the exchange target feeders 30 have been set, generates an exchange instruction based on the position information of the exchange target feeder 30 (S135), specifies the target component mounter 20, sends the exchange instruction of feeder 30 to robot control device 59 of exchange robot 50 (S140), and then ends processing. Note that, CPU 80a acquires position information of exchange target feeders 30 from supply area information and stock area information that the target component mounter 20 memorizes on HDD 28c. Robot control device 59 that has received an exchange instruction controls robot moving device 51 to move exchange robot 50 in front of the specified component mounter 20. Also, robot control device 59 controls robot moving mechanism 51 and feeder transfer device 53 so as to perform feeder 30 exchange processing at the specified component mounter 20. Accordingly, exchange robot 50 removes unnecessary feeders from supply area 20A and attaches them to stock area 20B, and removes required feeders from stock area 20B and attaches them to supply area 20A. Note that, CPU 28a of mounting control device 28 acquires information of set feeders 30 from feeder control device 39 via the connection of connectors 35 and 45, and updates the supply area information and stock area information of HDD 28c. Initial setting related processing of S115 is described in detail below. Initial setting related processing is described below with respect to one component mounter 20, but similar processing is performed with respect to each component mounter 20 that determines it is feeder initial set timing. Note that, each exchange related processing of S120 and S125 is described after describing processing of component mounter 20.

Figure 8:
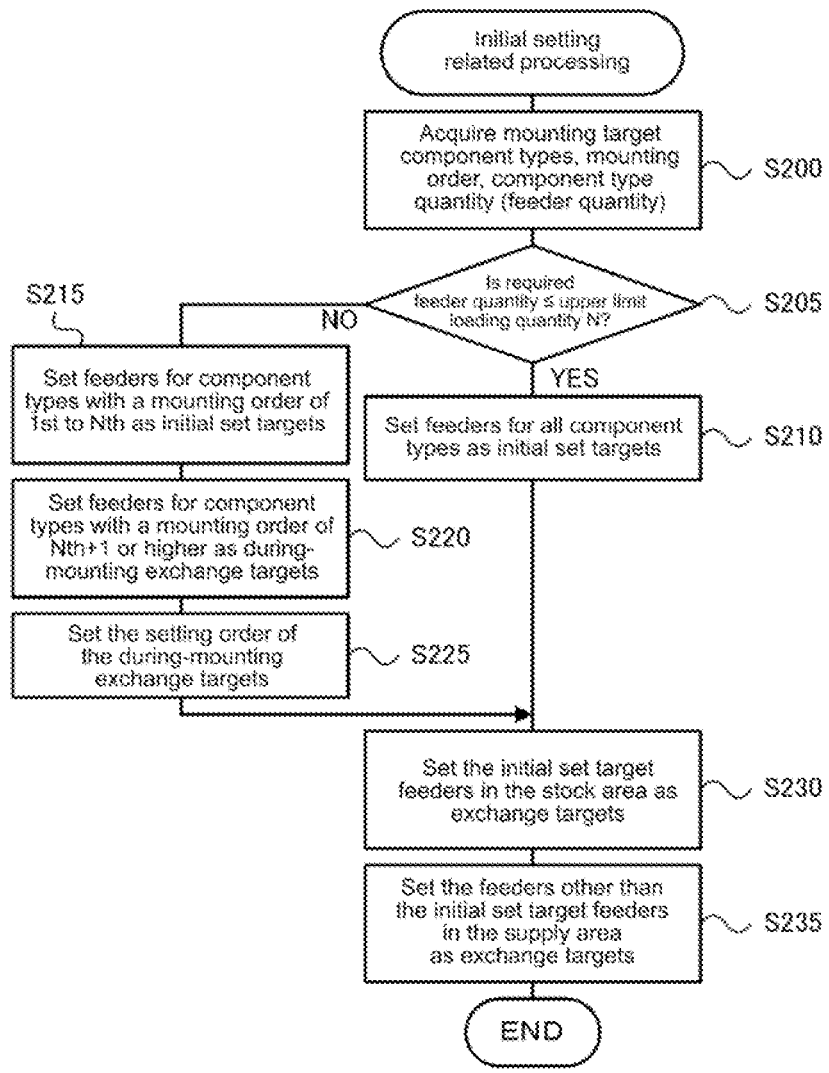
FIG. 8 is a flowchart showing an example of initial setting related processing.

FIG. 8 is a flowchart showing an example of initial setting related processing. With processing of FIG. 8, CPU 80a of management device 80, first, based on a production program or the like of board S for which the processing target component mounter 20 is to start mounting processing, acquires information required for initial setting of feeders 30 such as the mounting target component types, the component type mounting order, and the quantity (component type quantity, required feeder quantity) of feeders 30 required for processing (S200). Next, CPU 80a determines whether the required feeder quantity is equal to or less than the upper limit loading quantity N of supply area 20A (S205), and if determining that the required feeder quantity is equal to or less than the upper limit loading quantity N, sets feeders 30 for all component types as initial set targets (S210). And, CPU 80a, from the stock area information that the processing target component mounter 20 memorizes on HDD 28c, sets the initial set target feeders 30 in stock area 20B as the exchange target (S230). Also, CPU 80a, from the supply area information that the processing target component mounter 20 memorizes on HDD 28c, among the feeders 30 that are not the initial set target in supply area 20A, sets the same quantity of feeders 30 set as exchange targets in S230 as exchange targets (S235), then ends processing. In this manner, CPU 80a, when the required feeder quantity is equal to or less than upper limit loading quantity N, determines that all feeders 30 can be set and sets them as initial set targets. Then, CPU 80a, in S135 of feeder exchange instruction sending processing of FIG. 7, with regard to each feeder 30 set as an exchange target in S230 and S235, generates an exchange instruction such that all the feeders 30 required for mounting processing are set in supply area 20A, and such that unnecessary feeders 30 set in supply area 20A are set in stock area 20B.

On the other hand, CPU 80a, when determining in S205 that the required feeder quantity exceeds the upper limit loading quantity N, set the feeders 30 for component types which a mounting order of 1st to Nth as the initial set targets (S215). That is, CPU 80a, in a case in which not all the feeders 30 required for mounting processing can be loaded in supply area 20A, sets a portion of the feeders 30 as initial set targets. Continuing, CPU 80a sets the remaining feeders, that is, feeders 30 for a component type with a mounting order of Nth+1 or higher, as during-mounting exchange targets (S220), and sets the setting order of the during-mounting exchange targets in the same order as the mounting order of Nth+1 and higher (S225). And, CPU 80a, from the stock area information of the processing target component mounter 20, sets the initial set target feeders 30 in stock area 20B as exchange targets. Also, CPU 80a, from the supply area information of the processing target component mounter 20, sets all the feeders 30 in supply area 20A except for the initial set targets (including during-mounting exchange targets) as exchange targets (S235), and ends processing. In this manner, CPU 80a, in a case in which it is not possible to load all the feeders required for mounting processing in supply area 20A, sets feeders for which the mounting order is 1st to Nth (upper limit loading quantity N) as initial set targets, and sets the remaining feeders 30 with a mounting order of Nth+1 as during-mounting exchange targets. Then, CPU 80a, in S135 of feeder exchange instruction sending processing of FIG. 7, with regard to each feeder 30 set as an exchange target in S230 and S235, generates an exchange instruction such that a portion of the feeders 30 required for mounting processing are set in supply area 20A, and such that unnecessary feeders 30 set in supply area 20A (including during-exchange targets) are set in stock area 20B.

Here, the mounting order of component types during mounting processing of one board S (a single board S) is determined in advance based on the component mounting efficiency and the like. However, in the first embodiment, when the required feeder quantity exceeds upper limit loading quantity N, CPU 80a of management device 80 or CPU 28a of mounting control device 28 may change the mounting order. For example, CPU 80a may change the mounting order based on the component quantity (mounting quantity, supply quantity) of each component type to be mounted during mounting processing of the one board S. CPU 80a may change the mounting order in order of largest mounting quantities, in which case, the initial set targets are feeders 30 for component types from the largest mounting quantity to the Nth largest mounting quantity, and the during-mounting exchange targets are the feeders 30 with relatively small mounting quantities (supply quantities). Alternatively, CPU 80a may change the mounting order in order of smallest mounting quantities, in which case, the initial set targets are feeders 30 for component types from the smallest mounting quantity to the Nth largest mounting quantity, and the during-mounting exchange targets are the feeders 30 with relatively large mounting quantities (supply quantities).

Figure 9:
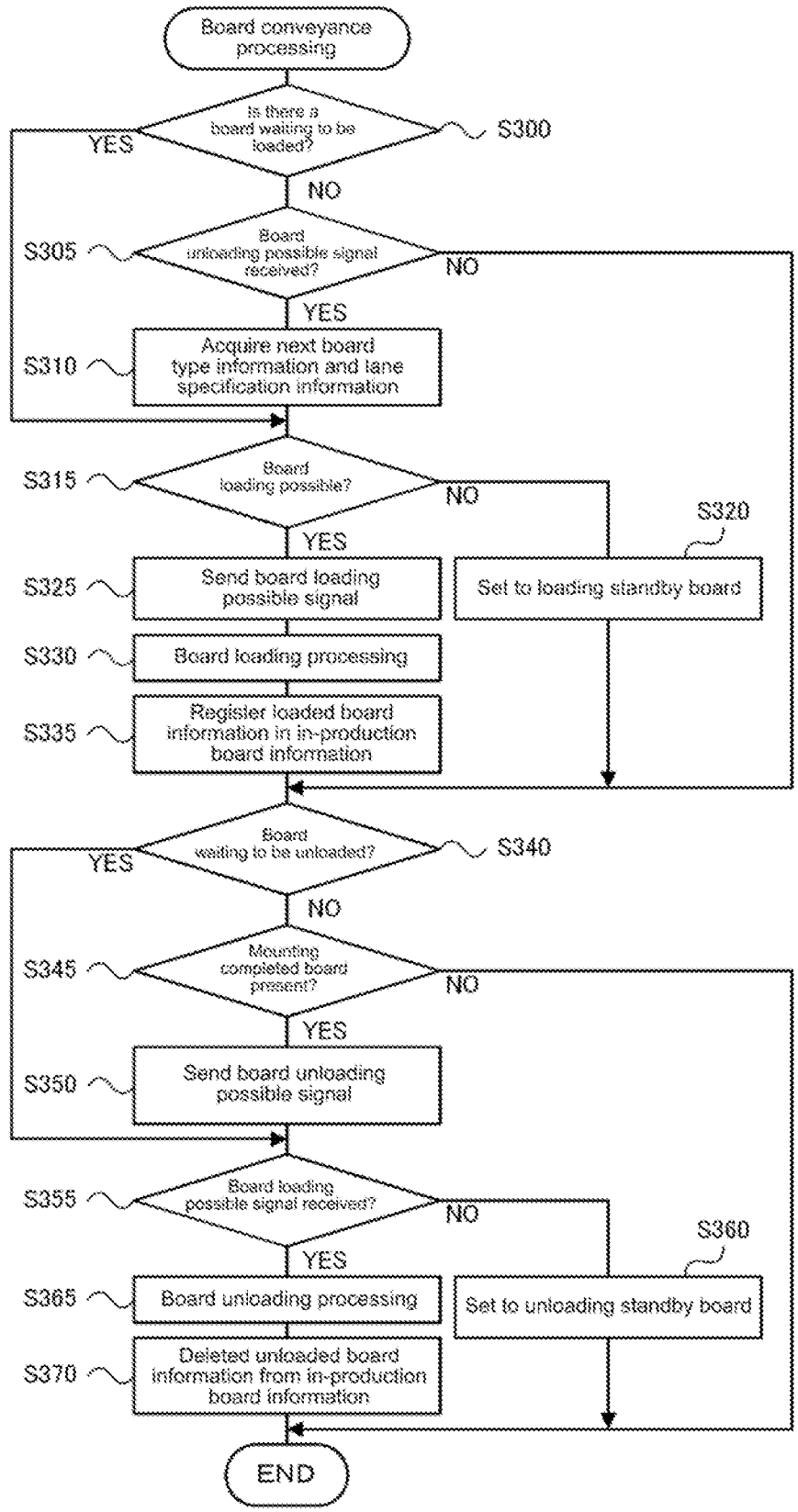
FIG. 9 is a flowchart showing an example of board conveyance processing.

Processing performed by component mounter 20 is described next. FIG. 9 is a flowchart showing an example of board conveyance processing. This processing is performed at a specified interval by CPU 28a of mounting control device 28 of each component mounter 20. During processing of FIG. 9, CPU 28a of mounting control device 28, first, determines whether there is a board waiting to be loaded to either of a first lane or a second lane (S300). CPU 28a, when determining that there is no board waiting to be loaded, determines whether a board unloading possible signal has been received from the component mounter 20 adjacent on the upstream side (S305). The board unloading possible signal is a signal sent to management device 80 when mounting of components to a single board S has been completed at the component mounter 20 adjacent to the upstream side. This board unloading possible signal includes information of the board type of board S, lane specifying information for which lane board S is conveyed in, and the like, and is sent (transferred) to the downstream component mounter 20 from the component mounter 20 adjacent on the upstream side via management device 80. CPU 28a, when determining that a board unloading possible signal has not been received, proceeds to S340. Further, CPU 28a, when determining that board unloading possible signal has been received, acquires information of the board type that is the target for the next mounting processing and lane specifying information from the board unloading possible signal (S310), and determines whether board S can be loaded (loading possible) at the specified lane (S315). Note that, CPU 28a, in a case in which mounting processing is being performed on a board S at the specified lane, or a case in which changeover work is required by an operator before loading the board to the specified lane, determines that loading a board S is not possible. On the other hand, CPU 28a, in a case in which the board S has already been unloaded from the specified lane, determines that loading a board S is possible.

CPU 28a, when determining in S315 that loading a board S is not possible, sets the board S as a loading standby board linked to the lane specified in the board unloading possible signal (320), and proceeds to S340. CPU 28a, after setting the loading standby board in S320, determines in S300 that there is a loading standby board, skips S305 and S310, and proceeds to S315. On the other hand, CPU 28a, when determining that loading a board S is possible in S315, sends a board loading possible signal including the lane specifying information specifying to which lane loading is possible to management device 80 (S325). Management device 80 that has received this board loading possible information sends (transfers) a board loading possible signal to the component mounter 20 adjacent on the upstream side. The component mounter 20 on the upstream side, upon receiving the board loading possible signal, controls board conveyance device 21 such that board S in the specified lane is conveyed. Thus, CPU 28a performs board loading processing of controlling board conveyance device 21 such that the board S conveyed from the upstream component mounter 20 is loaded (S330), registers the board type and identification information of the loaded board S linked to the lane into which the board S was loaded in the in-production board information (not shown) that is memorized in RAM 28d (S335), and then proceeds to S340. Note that, CPU 28a controls mark camera 24 so as to image marks provided on the loaded board S, and registers identification information of board S acquired from the imaging in the in-production board information.

Next, CPU 28a determines whether there is a board waiting to be unloaded from either the first lane or the second lane. CPU 28a, upon determining that there is no board waiting to be unloaded, determines whether there is a board S for which mounting processing has been completed at either of the first lane or the second lane (S345), and if determining that there is no board S for which mounting processing has been completed, ends processing. On the other hand, if CPU 28a determines that there is a board S for which mounting processing has been completed, CPU 28a sends a board unloading possible signal including information such as the board type of the board S and the specified lane in which the board S was conveyed to management device 80 (S350). Management device 80 that has received this board unloading possible information sends (transfers) a board unloading possible signal to the component mounter 20 adjacent on the downstream side. Then, CPU 28a determines whether a board loading possible signal has been received from the downstream component mounter 20 (S355), and if a board loading possible signal has not been received, CPU 28a sets the board S for which mounting processing has been completed as an unloading standby board (S360), and ends processing. On the other hand, if CPU 28a determines that a board loading possible signal has been received, CPU 28a controls board conveyance device 21 so as to convey the board S of the lane specified in the board loading possible signal (S365), deletes information related to the unloaded board S from the in-production board information of RAM 28d (S370), and ends processing.

Figure 10:
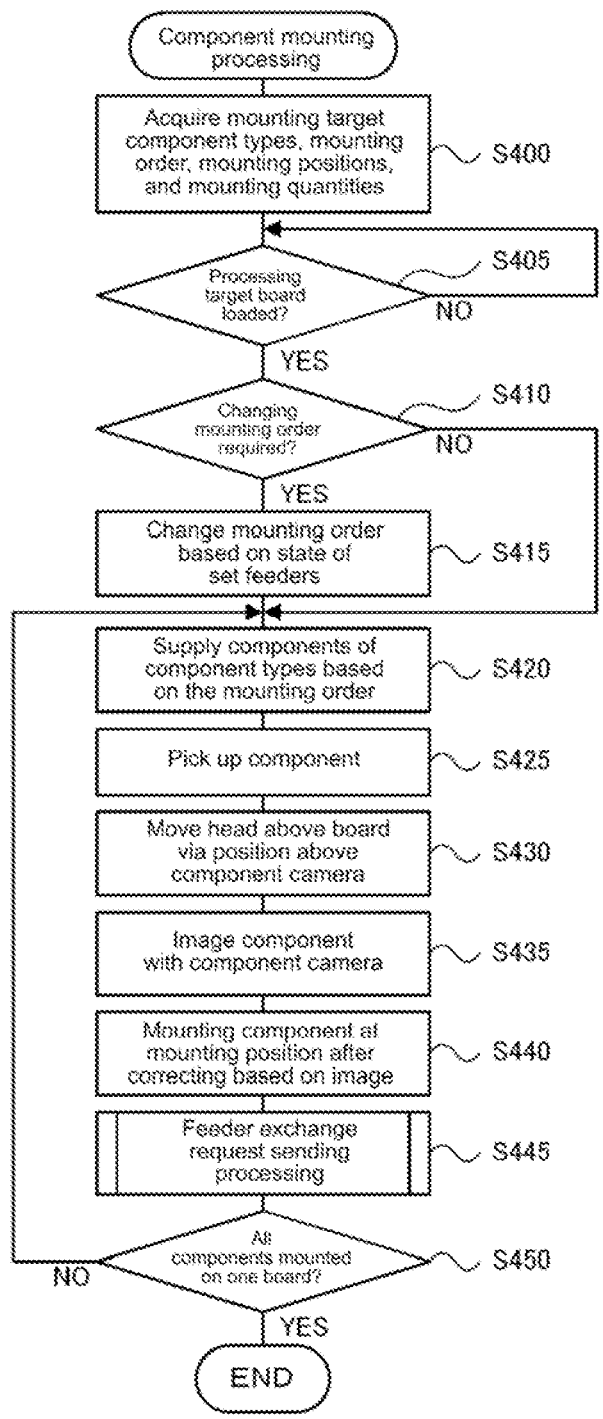
FIG. 10 is a flowchart showing an example of component mounting processing.

FIG. 10 is a flowchart showing an example of component mounting processing. This processing is performed at a specified interval by CPU 28a of mounting control device 28 of each component mounter 20. With processing of FIG. 10, CPU 28a of mounting control device 28, first, based on the production program of board S, acquires information required for mounting processing such as the mounting target component types, the mounting order of the component types, mounting positions of each component, and mounting quantities (S400). Then, CPU 28a waits until a board S of the board type that is the mounting processing target has been loaded to the mounting processing target lane (the first lane or the second lane) (S405). When the board S of the board type that is the mounting processing target has been loaded to the mounting processing target lane, CPU 28a determines whether it is necessary to change the mounting order of the component types (S410), and if necessary changes the mounting order (S415), or if not necessary, skips S415. A case when changing is required is described later.

Next, CPU 28a supplies the type of components based on the mounting order from one of the feeders 30 of the multiple feeders 30 set in supply area 20A (S420), and controls head 22 to pick up (collect) a supplied component using a suction nozzle (S425). Continuing, CPU 28a controls head moving mechanism 23 such that head 22 moves above board S via a position (specified position) above component camera 25 (S430), and controls component camera 25 so as to capture an image of the component when the component held by the suction nozzle is above component camera 25. Then, CPU 28a controls head 22 and head moving mechanism 23 to mount the component on board S at a mounting position that is corrected based on the pickup orientation of the component as captured in the image (S440). CPU 28a, upon performing this mounting of the component on board S, performs feeder exchange request sending processing (S445) of sending a feeder exchange request to management device 80 if exchange of a feeder 30 is required, and determines whether all components have been mounted on the single board S that is the mounting target. CPU 28a, if determining that not all the components have been mounted, returns to S420 and repeats processing from there, and if determining that all components have been mounted, ends processing.

Figure 11:
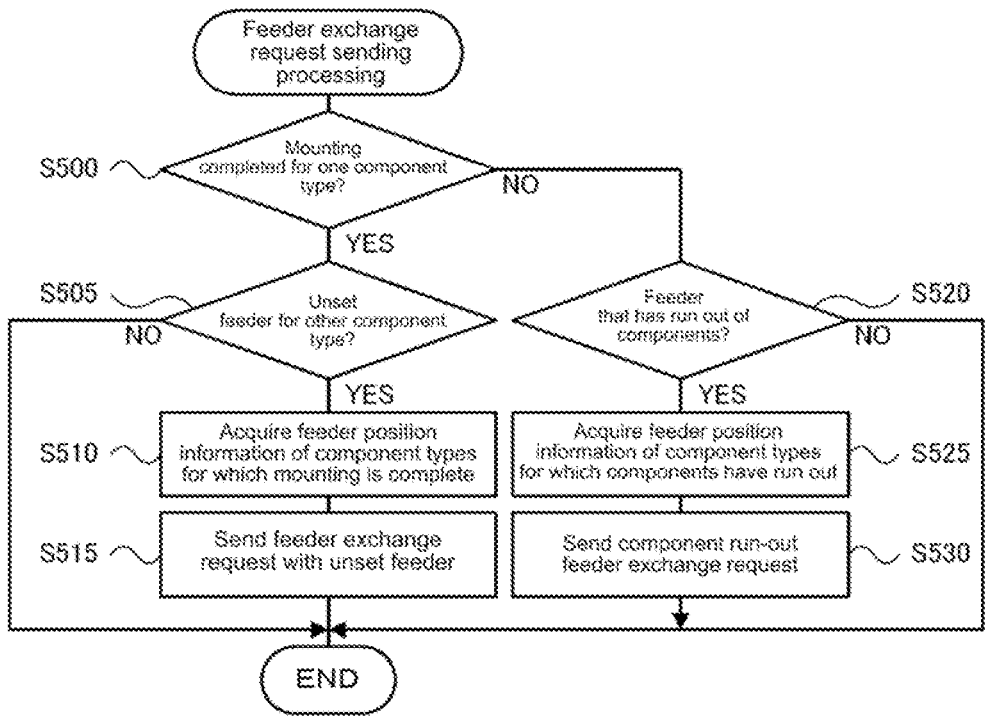
FIG. 11 is a flowchart showing an example of feeder exchange request sending processing.

The feeder exchange request sending processing of S445 is performed based on the flowchart of FIG. 11. With processing of FIG. 11, CPU 28a of mounting control device 28 determines whether mounting of one type of component has been completed at that time (S500), and if determining that mounting of one type of component has been completed at that time, determines whether there is a feeder 30 (during-mounting exchange target feeder 30) that has not been set in supply area 20A among the feeders 30 of another component type that is required for the current mounting processing (S505). Here, if feeders 30 for all the component types required for mounting processing that were set as initial set targets in the above initial setting related processing are set, CPU 28a determines that there are no unset feeders 30. On the other hand, if feeders 30 for a portion of component types are set as initial set targets in initial setting related processing, but not all the during-mounting exchange target feeders 30 are set in supply area 20A yet, CPU 28a determines that there is an unset feeder 30. CPU 28a, if determining in S505 that there are no unset feeders 30, ends processing as is. On the other hand, CPU 28a, if determining in S505 that there is an unset feeder 30, acquires position information of a feeder 30 of a component type for which mounting has been completed from the supply area information memorized on HDD 28c (S510), and sends a feeder exchange request requesting exchange with an unset feeder in supply area 20A to management device 80 (S515), then ends processing. Note that, CPU 28a sends the position information of the feeder 30 acquired in S510 included in the feeder exchange request.

Also, CPU 28a, if determining in S500 that mounting (supply) of a certain component type has not been completed at that time, determines whether the remaining quantity of stored components is zero, that is, if a feeder 30 has run out of components (S520). CPU 28a, if determining that a feeder 30 running of component has not occurred, ends processing. On the other hand, CPU 28a, if determining that a feeder 30 has run out of components, acquires the position information of the feeder 30 of the component type that has run out from the supply area information memorized on HDD 28 (S525), sends a component run-out feeder exchange request to management device 80 (S530), and ends processing. Note that, CPU 28a sends the position information and the component type information acquired in S525 included in the feeder exchange request.

When such a feeder exchange request is sent from mounting control device 28, CPU 80a of management device 80 determines that a feeder exchange request was received during S105 of the feeder exchange instruction sending processing of FIG. 7. Also, CPU 80a, in a case of receiving a feeder exchange request when a component run-out occurs, performs component run-out exchange related processing of S120, and in a case of receiving a feeder exchange request of an unset feeder, performs non-component-run-out exchange related processing of S125. With component run-out exchange related processing of S120, CPU 80a performs processing for setting feeders 30 that have run out of components and feeders 30 of the same component type that are in stock area 20B as exchange targets, but not being requirements for the first embodiment, detailed descriptions are omitted. Note that, if there is not a feeder 30 with the same component type in stock area 20B, CPU 80a reports that fact to an operator and issues instructions to set the required feeder 30, and performs processing to move exchange robot 50 to a storage location of feeder 30 to convey required feeders 30.

Figure 12:
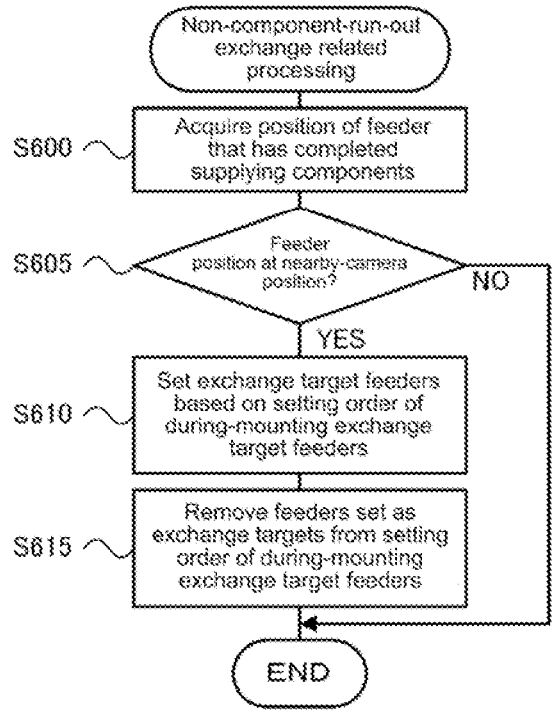
FIG. 12 is a flowchart showing an example of exchange related processing for a non-component-run-out occurrence.

Also, non-component-run-out exchange related processing of S125 is performed based on the flowchart of FIG. 12. In processing of FIG. 12, CPU 80a of management device 80, first, from the received feeder exchange request, acquires position information of the feeder 30 for which supply of components ended during mounting processing of the single board S (S600), and determines whether the position of that feeder 30 is at a nearby position (nearby-camera position) that includes a position directly in front of component camera 25 (S605). CPU 28a, for example, determines a total of three feeders 30 to be at the nearby-camera position, the feeder 30 facing the center of component camera 25 in the X direction (left-right direction) (that is, feeder 30 at the position directly in front), and the two feeders 30 adjacent to the left and right of that feeder 30. CPU 28a, if determining that the position of the feeder 30 of the feeder exchange request in S605 is not at the nearby-camera position, ends processing as is.

CPU 80a, when determining that the position of the feeder 30 that is the target of the feeder exchange request is at the nearby-camera position, based on the setting order of the during-mounting exchange target feeder 30 set in S225 of the feeder initial setting processing of FIG. 8, sets the feeder 30 next in the setting order as the exchange target feeder 30 (S610). In this manner, CPU 80a, when a feeder 30 has completed supplying components, sets the next feeder 30 based on the setting order of the during-mounting exchange target feeders 30. Then, CPU 80a removes the feeder 30 that was set as the exchange target from the setting order of the during-mounting exchange target feeders 30 (S615), and ends processing. CPU 80a, in S135 of feeder exchange instruction sending processing of FIG. 7, generates an exchange instruction such that feeder 30 that has completed supplying components is set to stock area 20B, and during-mounting exchange target feeder 30 (the feeder 30 set as the exchange target in S610) is set in supply area 20A. Thus, even if there are remaining housed components, feeder 30 is exchanged by exchange robot 50 with the during-mounting exchange target feeder 30. Therefore, component mounter 20, in a case in which it is not possible to load all the feeders 30 required for mounting processing on supply area 20A, even in a case in which feeders 30 for which the mounting order is 1st to Nth are set as initial set targets and mounting processing started, it is possible to set the remaining feeders 30 for which the mounting order is Nth+1 (during-mounting exchange target feeders 30) consecutively to supply area 20A during mounting processing of the single board S. Also, because during-mounting exchange target feeders 30 are set at a position nearby to component camera 25 during mounting processing, head 22 that has picked up the supplied component using a suction nozzle is able to shorten the movement time when moving above board S via a position above component camera 25. Accordingly, because it is possible to perform mounting processing by moving during-mounting exchange target feeders 30 to a position that is better for the movement efficiency of head 22, it is possible to perform mounting processing more efficiently. Note that, as described above, in a case in which CPU 80a changes the mounting order to an order of smallest mounting quantities, during-mounting exchange targets are the feeders 30 for which the mounting quantity (supply quantity) is relatively large. Thus, by the during-mounting exchange target feeders 30 being set at a position nearby component camera 25 during mounting processing, it is possible to further improve the movement efficiency of head 22.

Figure 13:
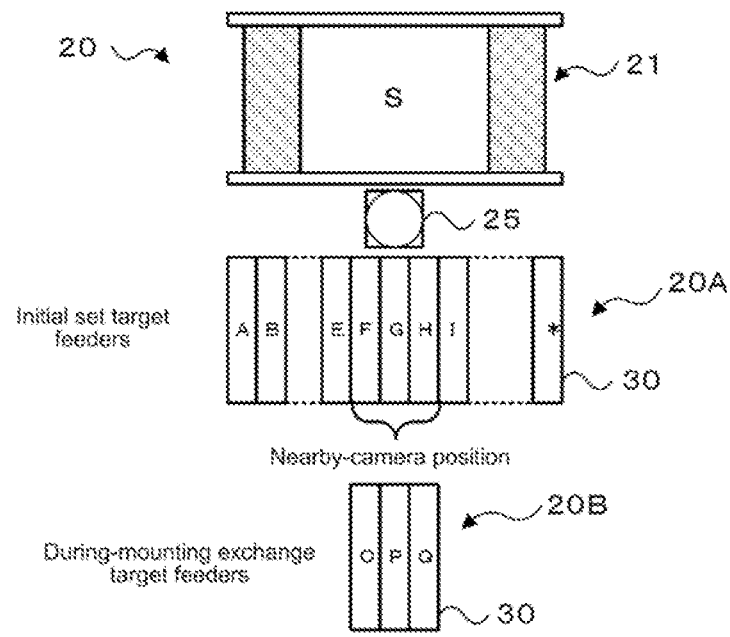
FIG. 13 illustrates a state of exchanging feeder 30 during mounting processing in a first embodiment.
Figure 13:
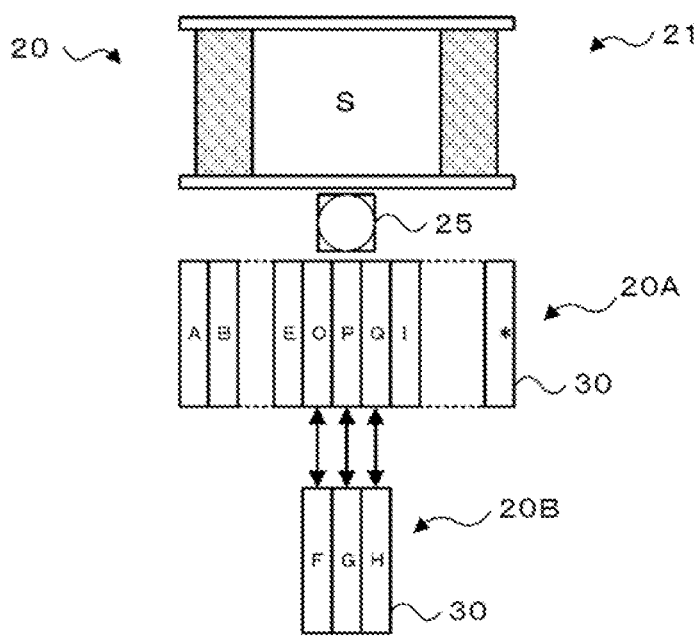

FIG. 13 illustrates a state of exchanging feeder 30 during mounting processing in a first embodiment. As shown in FIG. 13(a), when mounting processing is started (initial setting time), feeders for component type A to * are set in supply area 20A as initial setting target feeders, and three feeders 30 for the remaining component types O, P, and Q are set in stock area 20B as during-mounting exchange target feeders. Note that, other feeders 30 are set in stock area 20B, but these are not shown in the figure. Also, feeder 30 for component type G that is positioned facing the center of component camera 25 in the left-right direction and the two adjacent feeders 30 for component types F and H are taken as the nearby-camera position. CPU 80a, even if receiving a non-component-run-out exchange request of the feeders 30 for component types A or B during production, determines that they are not at the nearby-camera position, and does not perform exchange of the feeder 30. However, CPU 80a, if receiving a non-component-run-out exchange request of the feeders 30 for any of the component types F, G, or H during production, determines that they are at the nearby-camera position, and performs exchange with a during-mounting exchange target feeder. By this, the three during-mounting exchange target feeders for component types O, P, and Q are consecutively set in supply area 20A (refer to FIG. 13[b]). If such feeder 30 exchange work is to be performed by an operator, the operator must judge the timing of when supply will be completed for each component type to perform the work, meaning the workload would be great. With the present disclosure, during-mounting exchange target feeders 30 in stock area 20B are exchanged by exchange robot 50 with feeders 30 in supply area 20A, therefore there is no increase in workload, and feeders 30 can be exchanged at an appropriate time.

Also, as described above, the mounting order may be changed by CPU 80a of management device 80 or CPU 28a of mounting control device 28. For example, CPU 28a of mounting control device 28 takes board S for which mounting processing is to be performed first as the original mounting order, and takes the board S of the same type for which mounting processing is to be performed next as the reverse mounting order to the original mounting order (that is, making the component type last in the original mounting order the first component type to be mounted), and subsequently alternating between the original mounting order and the reverse mounting order. In this case, in a case in which the setting state of feeders 30 when mounting processing of a single board S is completed is that of FIG. 13(b), mounting CPU 28a may start mounting processing of the next board S in that state without returning to the state of FIG. 13(a). Also, when starting mounting processing in the state shown in FIG. 13(b), CPU 28a may determine in S410 of component mounting processing of FIG. 10 that changing the mounting order is required, and may change to a reverse mounting order in S415. Of course, CPU 80a of management device 80 may return feeders 30 to the initial setting state (as shown in FIG. 13[a]), each time mounting processing is completed or during mounting processing of a single board S.

Correspondences between constituent elements of the first embodiment and constituent elements of the disclosure will be clarified here. Feeder 30 corresponds to a component supply unit, exchange robot 50 corresponds to a unit exchanging device, and component mounter 20 corresponds to a component mounter. Robot control device 59 and management device 80 that sends an exchange instruction to robot control device 59 correspond to an exchange control device. The above correspondences similarly apply to the second to fourth embodiments. Also, CPU 80a of management device 80 that performs S200 of the initial setting related processing of FIG. 8 corresponds to an information acquiring section, CPU 80a that performs S205 of initial setting related processing corresponds to a unit quantity determining section, and CPU 80a that performs S215 to S225 of initial setting related processing corresponds to a set contents deciding section. CPU 80a that sends the feeder exchange request for the unset feeder sent component mounter 20 in S515 of the feeder exchange request sending processing of FIG. 11 and performs S125 (the non-component-run-out exchange relate processing of FIG. 12), S135 and S140 of the feeder exchange instruction sending processing of FIG. 7 corresponds to an instruction output section.

Component mounting system 10 of the first embodiment described above is provided with multiple component mounters 20 that mount components supplied from multiple feeders 30 onto a board S, exchange robot 50 that exchanges the feeders 30 set on each of the component mounters 20, and management device 80 that generates a feeder 30 exchange instruction for controlling exchange robot 50 and sends the exchange instruction to exchange robot 50. Also, management device 80 of component mounting system 10, in a case in which mounting processing is started with a portion of the multiple feeders 30 required for mounting processing of a single board S set in supply area 20A, sends an exchange instruction to robot control device 59 during mounting processing of board S so as to exchange a feeder 30 that has completed supplying components with a during-mounting exchange target feeder 30, even if there are remaining components. That is, component mounting system 10 starts mounting processing in a state in which a portion of the initial set target feeders 30 of the multiple feeders 30 required for mounting processing are set on component mounter 20 (supply area 20A), and in which remaining feeders 30 (during-mounting exchange target feeders 30) are not set on component mounter 20 (supply area 20A). Also, component mounting system 10 performs mounting processing while switching feeders 30 that have finished supplying components with remaining feeders 30 using exchange robot 50 during mounting processing of a single board S. By this, because it is possible to perform mounting processing while exchanging required feeders 30 within the range of the upper limit loading quantity N of component mounter 20, it is possible to improve the efficiency of mounting processing. Also, it is possible to curtail increasing the size of component mounter 20 in order to increase the upper limit loading quantity N of feeders 30.

Note that, in the first embodiment, management device 80 exchanges the feeder 30 that has finished supplying components with a during-mounting exchange target feeder 30 in a case in which the feeder 30 that has finished supplying components is in the nearby-camera position, but the configuration is not limited to this. For example, management device 80 may exchange the feeder 30 that has finished supplying components with a during-mounting exchange target feeder 30 in a case in which the feeder 30 that has finished supplying components is in a position directly in front of the camera. This improves the effect of reducing the movement time of head 22 even further. Alternatively, management device 80 may exchange a feeder 30 that has completed supplying components with a during-mounting exchange target feeder 30 consecutively when a feeder 30 that has completed supplying components arises, regardless of the position of the feeder 30. By this, management device 80 can consecutively set each during-mounting exchange target feeder 30 in supply area 20A before supply is to be started from each during-mounting exchange target feeder 30, such that mounting processing (component supply) is not interrupted by exchange of feeders 30. Also, management device 80 may decide the timing of exchange of feeders 30 or the mounting order of each component type such that during-mounting exchange target feeders 30 are as far as possible set at the nearby-camera position or the position directly in front of the camera before supply of components is to be started from each during-mounting exchange target feeder 30 (so as not to interrupt component supply), by considering factors such as the time required for mounting processing of each component by head 22, and the time required to exchange feeders 30.

Second Embodiment

Figure 14:
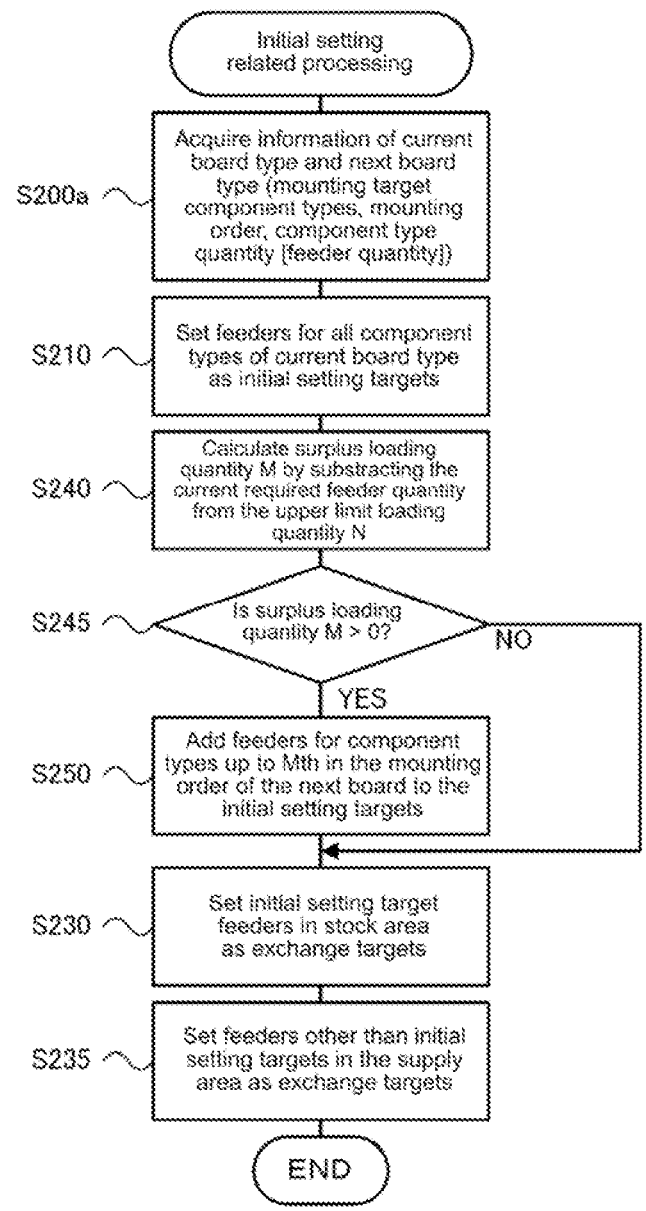
FIG. 14 is a flowchart showing initial setting related processing of a second embodiment.

A second embodiment of the present disclosure is described below. The configuration of component mounting system 10 (component mounter 20, exchange robot 50) of the second, third, and fourth embodiments is the same as that of the first embodiment, so descriptions are omitted. With the second embodiment, the initial setting related processing of FIG. 14 is performed instead of that of FIG. 8. With the processing of FIG. 14, CPU 80a of management device 80, first, acquires information of the board type for which mounting processing is to be performed, and the board type for which mounting processing is to be performed next (S200a). Note that, as described above, the information is information such as mounting target component types, mounting order of each component type, and quantity of feeders 30 required for mounting processing (component type quantity, required feeder quantity). Next, CPU 80a sets feeders 30 for all component types as initial set targets (S210). Note that, in FIG. 14, the required feeder quantity does not exceed the upper limit loading quantity N, but there may be cases in which the required feeder quantity exceeds the upper limit loading quantity N. In this case, processing similar to the first embodiment, that is, processing of S215 to S225 of FIG. 8 may be performed.

Continuing, CPU 80a, by subtracting the required feeder quantity from the upper limit loading quantity N, calculates the surplus loading quantity M that is the quantity of remaining feeders that can be set when the required feeder quantity has been set in supply area 20A (S240), and determines whether the surplus loading quantity M exceeds zero (S245). CPU 80a, if determining that surplus loading quantity M exceeds zero, based on the information of the board type for which mounting processing is to be performed next, adds feeders 30 for component types for which the mounting order is up to M to the initial set targets (S250), performs the processing of S230 and S235, then ends processing. Note that, CPU 80a, if determining that surplus loading quantity M does not exceed zero, that is, determining that if the feeders 30 required for mounting processing of the current board type are set in supply area 20A then there are no empty slots in supply area 20A, skips S250, performs the processing of S230 and S235, then ends processing. By this, when starting mounting processing of the current board type, in addition to the feeders 30 required for the current board type, it is possible to load in advance at least a portion of the feeders 30 required for the next board type. Note that, surplus loading quantity M feeders 30 are feeders 30 that are not required for mounting processing of the current board type. Therefore, it is possible to start mounting processing of the current board type before settings all of the surplus loading quantity M feeders 30.

Figure 15:
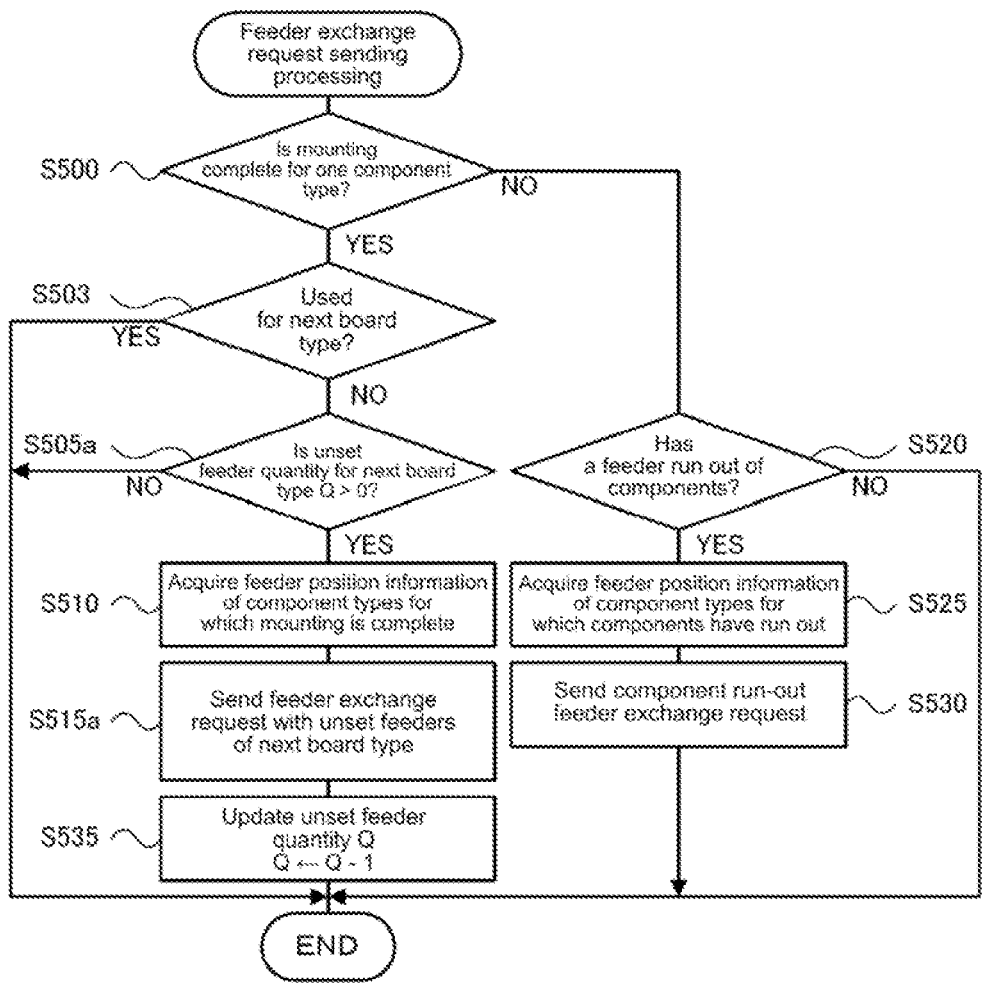
FIG. 15 is a flowchart showing feeder exchange request sending processing of a second embodiment.

Also, in the second embodiment, the feeder exchange request sending processing of FIG. 15 may be performed instead of that of FIG. 11. With the processing of FIG. 15, CPU 28a of mounting control device 28, first, determines whether supply has been completed for one of the component types for the current board type (the board type for which mounting processing is currently being performed) (S500), and if determining that it is not the correct timing for the completion of supply, performs the processing of S520 to S530, then ends processing. That is, CPU 28a sends a component run-out feeder exchange request to management device 80 if a feeder 30 runs out of components. On the other hand, CPU 28a, if determining that supply has been completed for one of the component types, determines whether the feeder 30 for which supply has been completed is to be used for mounting processing of the next board type based on the component types of the board type for which mounting processing is to be performed next (S503), and determines whether the unset feeder quantity Q of the next board type exceeds zero (S505a). This unset feeder quantity Q represents the quantity of feeders 30 not set in supply area 20A among the feeders 30 required for mounting processing of the next board type; setting of this value is described later. CPU 28a, if determining that the feeder 30 that completed supplying components this time is to be used in mounting processing of the next board type, or determining that the unset feeder quantity Q does not exceed zero, end processing as is. On the other hand, CPU 28a, if determining in S503 that the feeder 30 that completed supplying components this time is not to be used in mounting processing of the next board type, and determining in S505a that the unset feeder quantity Q exceeds zero, acquires the position information of the feeder 30 that completed supplying the component type from the supply area information of HDD 28c (S510). Continuing, CPU 28a sends a feeder exchange request for exchanging with an unset feeder of the next board type to management device 80 (S515a), subtracts one from the unset feeder quantity Q (S535), then ends processing. Note that, CPU 28a sends the position information of the feeder 30 acquired in S510 included in the feeder exchange request. CPU 80a of management device 80 that receives this feeder exchange request, performs non-component-run-out exchange related processing. However, with the second embodiment, CPU 80a omits determination processing of S605 during the non-component-run-out exchange related processing of FIG. 12. Therefore, management device 80, when receiving a feeder exchange request to exchange with an unset feeder of the next board type, exchanges the feeder 30 that has completed supplying components during mounting processing for the current board type with a feeder 30 required for mounting processing of the next board type. By this, it is not necessary to exchange feeders 30 when starting mounting processing of the next board type, or the time required for exchanging can be reduced when starting mounting processing of the next board type, thus allowing mounting processing of the next board type to be started quickly.

Figure 16:
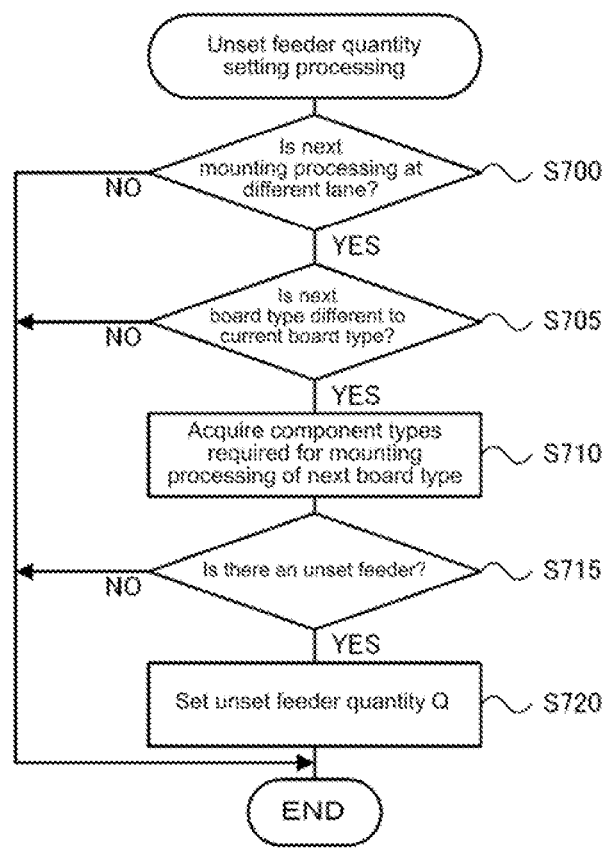
FIG. 16 is a flowchart showing an example of unset feeder quantity setting processing.

Next, setting processing of unset feeder quantity Q is described. FIG. 16 is a flowchart showing an example of unset feeder quantity setting processing. This processing is performed in a case in which CPU 28a of mounting control device 28 acquires the production program of the next board S during mounting processing of the current board type, or in a case in which information of the board type of the next mounting processing is acquired in S310 of the board conveyance processing of FIG. 9 during mounting processing of the current board type. With the processing of FIG. 16, CPU 28a determines whether the next mounting processing is to be performed at a different lane to that of the current mounting processing (S700), and whether the target of the next mounting processing is a different board type to that of the current mounting processing (S705). CPU 28a performs these determinations using information such as the production program of board S and in-production board information updated in S335 and S370 of the board conveyance processing of FIG. 9. CPU 28a, if determining that the next mounting processing is not to be performed at a different lane, or determining that the board is not a different board type, ends processing as is. On the other hand, CPU 28a, if determining that the next mounting processing is to be performed at a different lane and on a different board type, acquires information of the component types (feeder types) required for mounting processing of the next board (S710). Then, CPU 28a determines whether among the feeders 30 required for mounting processing of the next board type there are any unset feeders that are not set in supply area 20A (S715). CPU 28a, if determining that there is an unset feeder, sets the quantity of unset feeders 30 as unset feeder quantity Q (S720), and ends processing; and if determining that there are no unset feeders, ends processing as is. In this manner, CPU 28a, during production, if determining that a board type different to the board type current being produced (current mounting processing) is going to have mounting processing performed next at a different lane to the current mounting processing, in a case in which not all the feeders 30 required for mounting processing of the next board type are set in supply area 20A, sets the unset feeder quantity Q. Note that, the initial value of the unset feeder quantity Q is zero.

Figure 17:
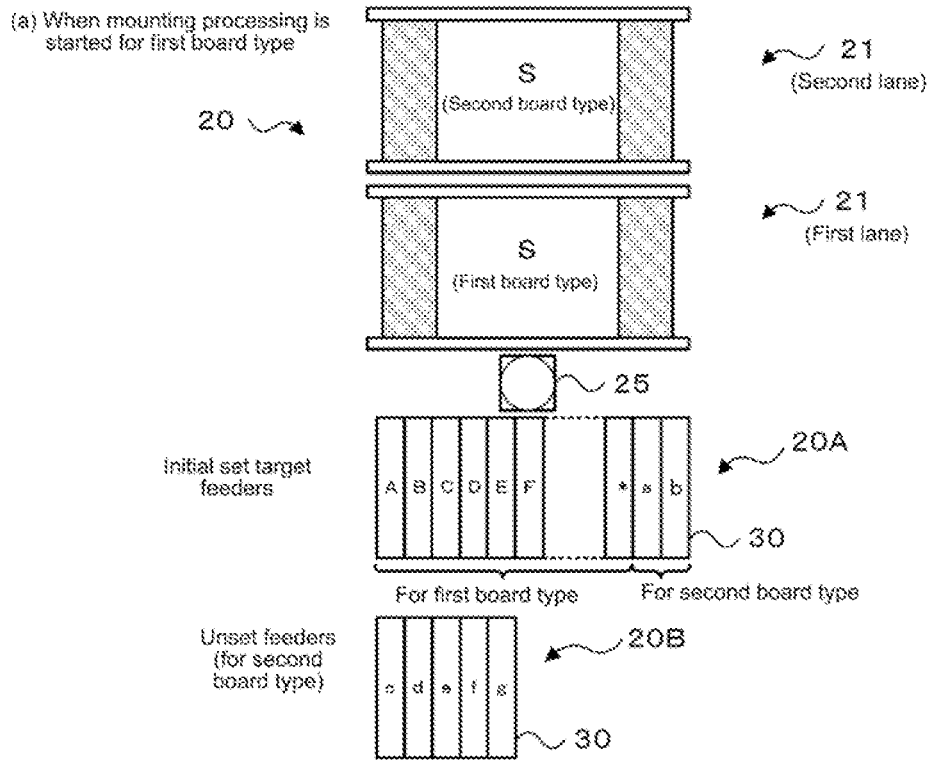
FIG. 17 illustrates a state of exchanging feeder 30 during mounting processing in a second embodiment.
Figure 17:
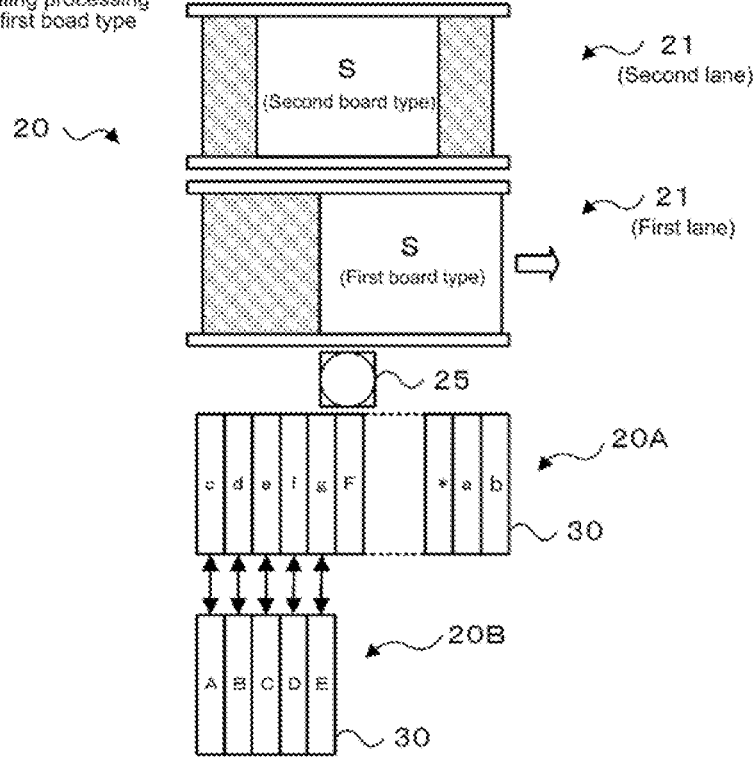

FIG. 17 illustrates a state of exchanging feeder 30 during mounting processing in a second embodiment. As shown in FIG. 17(a), when mounting processing of board type 1 is started (at initial setting point), feeders 30 from component types A to * to be used for the current (board type 1) mounting processing and feeders 30 of component types a and b to be used for mounting processing of the next board type (board type 2) are set in supply area 20A as initial setting target feeders. Also, unset feeders to be used in mounting processing of the next board type that are set in stock area 20B (not set in supply area 20A) are, as an example, the five feeders 30 of component types c to g. CPU 28a of mounting control device 28, if determining during mounting processing of the current board type 1 in the first lane that the next mounting processing is for board type 2 that is of a different type and is to be performed in the second lane, sets the unset feeder quantity Q to a value of five. Then, each time supply of each of the component types A, B, C, D, or E is completed during mounting processing of board S of the current board type 1, a feeder exchange request to exchange with an unset feeder is output to management device 80. CPU 80*a* of management device 80, whenever receiving a feeder exchange request, consecutively exchanges the feeder 30 that completed supplying components during mounting processing of the current board type 1 with an unset feeder to be used in the next mounting processing. Therefore, as shown in FIG. 17(*b*), when mounting processing of board type 1 is completed in the first lane and the board S is unloaded, all the feeders 30 to be used in mounting processing of the board type 2 of the second lane are set in supply area 20A. Accordingly, when the board is changed, mounting processing can be switched smoothly. Further, in a case in which a board S of board type 1 is conveyed in the first lane next, CPU 80*a*, each time supply of each of the component types a, b, c, d, e, f, or g is completed during mounting processing of board S of board type 2 in the second lane, performs consecutive exchange with feeders 30 of component types A, B, C, D, and E that are the unset feeder of the board type 1. Therefore, even in a case such as when the board type on which mounting processing is to be performed is different each time in each lane, feeder 30 exchange time when switching lanes is eliminated or reduced, and it is possible to quickly start mounting processing of a different board type in the next lane. If such feeder exchange work is to be performed by an operator, the operator must judge the timing of lane switching, meaning the workload would be great. In the present embodiment, because exchange of feeders 30 is performed by exchange robot 50 during mounting processing before lane switching, it is possible to quickly start mounting processing of a different board type in the next lane without increasing the workload.

Correspondences between constituent elements of the second embodiment and constituent elements of the disclosure will be clarified here. CPU 80*a* of management device 80 that performs S310, S335, and S370 of the board conveyance processing of FIG. 9 corresponds to an information acquiring section, CPU 80*a* that performs S700 and S705 of the unset feeder quantity setting processing of FIG. 16 corresponds to a board type determining section, and CPU 80*a* that performs S125, S135, and S140 of the feeder exchange instruction sending processing of FIG. 7 after receiving the feeder exchange request of the unset feeder sent from component mounter 20 in S515*a* of the feeder exchange request sending processing of FIG. 15 corresponds to an instruction output section.

Component mounting system 10 of the second embodiment as described above is configured such that each component mounter 20 performs mounting processing on a board S conveyed in two lanes (first lane and second lane) provided in parallel. Further, component mounting system 10, in a case in which the board type (current board type) on which mounting processing is being performed in one out of the two lanes is different to the board type (next board type) on which the next mounting processing is to be performed in the other lane, during mounting processing of the current board type, uses exchange robot 50 to exchange feeder 30 for which supply of components has been completed during mounting processing of a board S of the current board type, with a feeder 30 required for mounting processing of the next board type. That is, component mounting system 10, when mounting processing is performed for a board type different to the board type of the current mounting processing (mounting processing being performed) in a lane different to that of the current mounting processing, during mounting processing of the current board type, mounting processing is performed while consecutively exchanging feeders 30 that have completed supplying components during mounting processing for a single board S with feeders 30 required for mounting processing of the next board type. Accordingly, when mounting processing of the current board type, it is possible to quickly start mounting processing of the next board type. Further, when board S of different board types are conveyed in the two lanes, even in a case in which the total quantity of feeders 30 required for mounting processing for each board type exceeds the upper limit loading quantity N, it is possible to smoothly perform switching of the component type and the lane.

With the second embodiment, descriptions are given with the disclosure applied to a case with two lanes, a first lane and a second lane, but the configuration is not limited to this, and the disclosure may be applied to multiple lanes, for example, three lanes.

With the second embodiment, surplus loading quantity M feeders 30 of the next board type are included in the initial setting target feeders in supply area 20A, but the configuration is not limited to this, and surplus loading quantity M feeders 30 do not have to be included. That is, setting of each feeder 30 required for the next board type may be started during mounting processing of a board S of the current board type.

Third Embodiment

Figure 18:
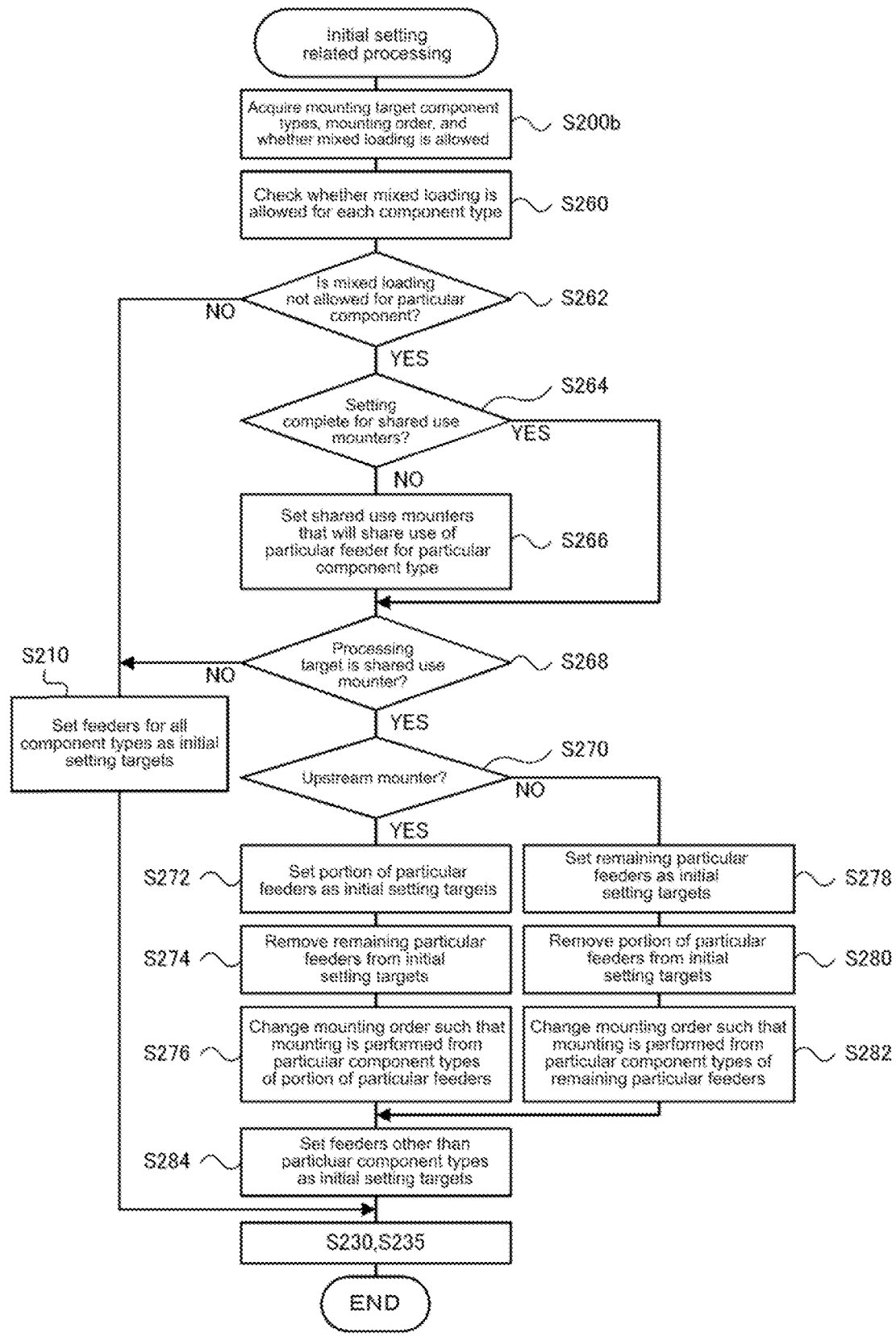
FIG. 18 is a flowchart showing initial setting related processing of a third embodiment.

A third embodiment of the present disclosure is described below. With the third embodiment, the initial setting related processing of FIG. 18 is performed instead of that of FIG. 8. With the processing of FIG. 18, CPU 80*a* of management device 80, first, acquires information related to the mounting target component types, the mounting order of the component types, and whether mixed loading of each component type is allowed (S200*b*), checks whether mixed loading of each component type is allowed (S260), and determines whether there is a component type for which mixed loading is not allowed (S262). Here, CPU 80*a* determines that mixed loading is not allowed for component types defined as not being allowed to be mixed based on component characteristics or components of a different production lot not being mounted within the same board (or components supplied from different feeders 30). For particular component types for which it is determined that mixed loading is not allowed, each component mounter 20 must share the same feeder 30 such that mounting is performed of components supplied from the same feeder 30. CPU 80*a*, if determining in S262 that there are no particular components for which mixed loading is not allowed, sets feeders 30 for all the component types as initial setting targets (S210), sets exchange target feeders 30 in S230 and S235, then ends processing. Note that, in FIG. 18, the required feeder quantity does not exceed the upper limit loading quantity N, but there may be cases in which the required feeder quantity exceeds the upper limit loading quantity N. In this case, processing similar to the first embodiment, that is, processing of S215 to S225 of FIG. 8 may be performed.

Also, CPU 80*a*, it determining in S262 that there is a particular component for which mixed loading is not allowed, determines whether shared use mounters that are component mounters 20 that will share the use of the feeder 30 (particular feeder) of the particular component type have been set (S264). CPU 80a, if determining that shared use mounters have not been set, based on the production program of board S, sets component mounters 20 that will share use of the particular feeder used for mounting the particular component type (S266), while if determining that shared use mounters have already been set, skips S266. Here, as an example of mounting of a particular component type for which mixed loading is not allowed, one may consider mounting processing in which a single board S is arranged straddling two adjacent component mounters 20, and mounting processing is performed in the mountable range on the single board S (the movement range of each head 22) at the two component mounters 20. In this case, CPU 80a, in S266, sets the two adjacent component mounters 20 as shared use mounters.

Continuing, CPU 80a determines whether the processing target of the current initial setting related processing is a shared use mounter (S268), and if it is not a shared use mounter, sets the feeders 30 for all the component types as initial setting targets (S210), performs processing of S230 and S235, then ends processing. On the other hand, CPU 80a, if determining that the processing target is a shared use mounter, further determines whether the processing target is a particular component mounter 20 (in this case, the upstream side one) of the shared use mounters (the two adjacent component mounters 20) (S270). CPU 80a, if determining that the processing target is the upstream component mounter 20, sets a portion of the particular feeders as initial setting targets (S272), excludes the remaining particular feeders from the initial setting targets (S274), and changes the mounting order of the component types at the upstream component mounter 20 such that mounting is performed from the particular component types of the portion of the particular feeders.

On the other hand, CPU 80a, if determining that the processing target is the downstream component mounter 20, sets the remaining particular feeders (the feeders excluded from the initial setting targets in S274) as initial setting targets (S278), and excludes the portion of particular feeders (the feeders set as initial setting targets in S272) from the initial setting targets (S280). Also, CPU 80 changes the mounting order of the component types at downstream component mounter 20 such that mounting is performed from the particular component types of the remaining particular feeders. That is, CPU 80a sets the particular feeders as initial setting targets of one of the shared used mounters, and excludes the particular feeders from the initial setting targets of the other shared use mounter. Further, CPU 80a, at each of the shared use mounters, changes the mounting order such that mounting is performed from the particular component type of the particular feeders as the initial setting targets. Note that, CPU 80a, when there is only one particular feeder, may set that particular feeder as an initial setting target of one of the shared used mounters, and exclude the particular feeder from the initial setting targets of the other shared use mounter. CPU 80a, after setting the initial setting targets and changing the mounting order in this manner, sets required feeders 30 other than those of the particular component types (that is, other than the particular feeders) as initial setting targets (S284), sets exchange target feeders 30 in S230 and S235, then ends processing.

Figure 19:
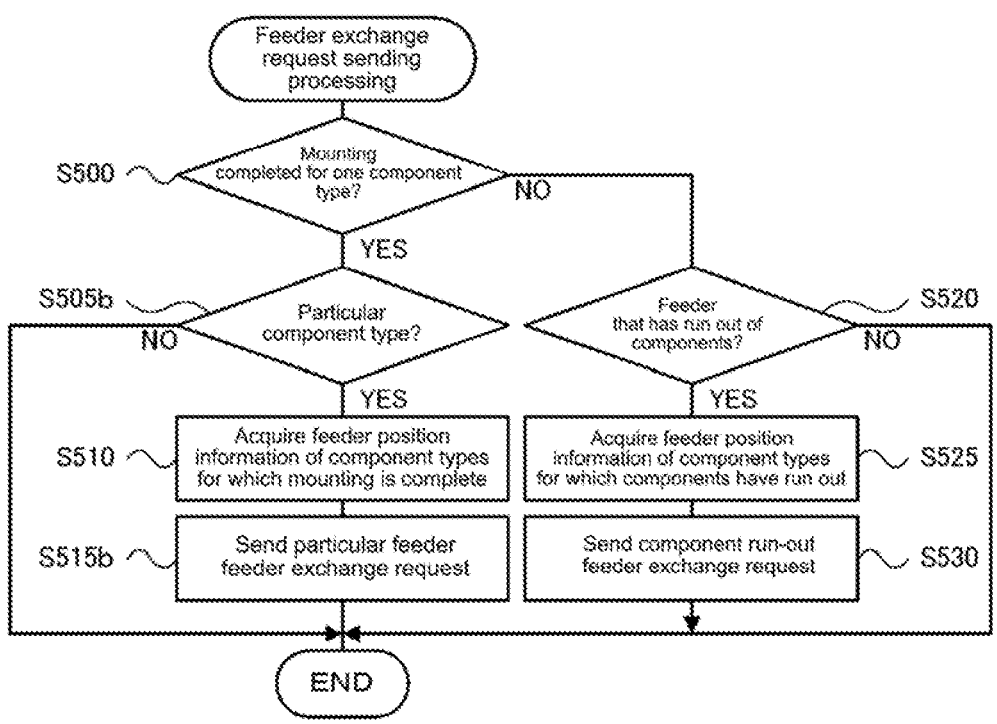
FIG. 19 is a flowchart showing feeder exchange request sending processing of a third embodiment.

Also, in the third embodiment, the feeder exchange request sending processing of FIG. 19 may be performed instead of that of FIG. 11. With the processing of FIG. 19, CPU 28a of mounting control device 28, first, determines whether supply has been completed for one of the component types (S500), and if determining that it is not the correct timing for the completion of mounting, performs the processing of S520 to S530 similar to FIG. 11, then ends processing. On the other hand, if determining that mounting of a certain component type has been completed at that time, determines whether that component type is a particular component type (S505b). CPU 28a, if determining that it is not a particular component type, ends processing as is. On the other hand, CPU 28a, if determining that it is a particular component type, acquires position information of the feeder 30 (particular feeder) of the particular component type for which mounting is complete from the supply area information of HDD 28c (S510), sends a feeder exchange request for requesting exchange of the particular feeder (S515b) to management device 80, then ends processing. Note that, CPU 28a sends the position information of the feeder 30 acquired in S510 included in the feeder exchange request. Management device 80 that receives this feeder exchange request performs non-component-run-out exchange related processing.

Figure 20:
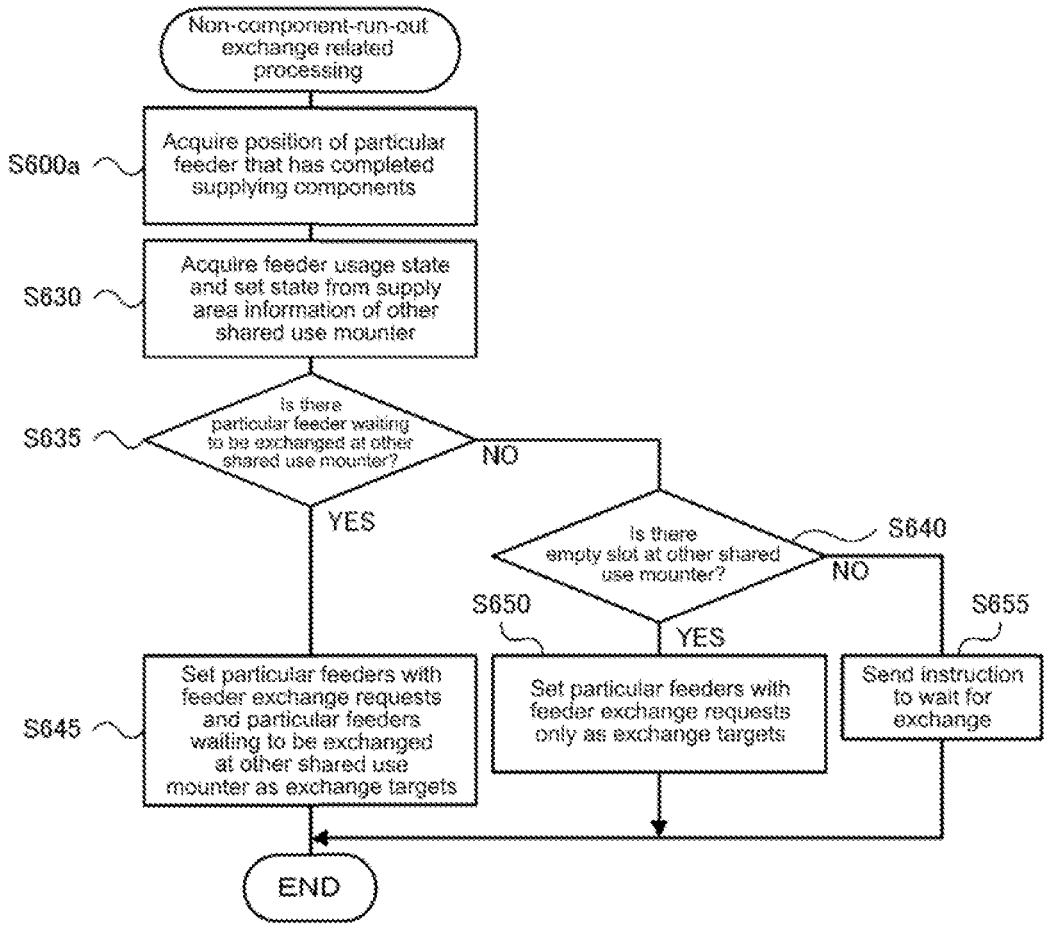
FIG. 20 is a flowchart of a third embodiment showing exchange related processing for a non-component-run-out occurrence.

In processing of FIG. 20, CPU 80a of management device 80, first, acquires position information of the particular feeder that has completed supplying components from the received feeder exchange request (S600a). Further, CPU 80a, at the shared use mounter different from the current sending origin of the feeder exchange request, acquires the usage state of each feeder 30 in supply area 20A and the set state of feeders 30 in supply area 20A from the supply area information memorized in HDD 28c (S630). CPU 80a, in S630, acquires information of particular feeders waiting to be exchanged and information of empty slots 42 in supply area 20A. And, CPU 80a, based on the acquired information, determines whether there are particular feeders waiting to be exchanged at the other shared use mounter (S635), and determines whether there are empty slots 42 at the supply area 20A of the other shared use mounter (S640). CPU 80a, if determining in S635 that there is a particular feeder waiting to be exchanged at the other shared use mounter, sets the particular feeder in the shared use mounter that was the sending origin of the received feeder exchange request and the particular feeder that is waiting to be exchanged in the other shared used mounter as exchange targets (S645), then ends processing. Therefore, in a case in which supply of components has been completed from a particular feeder at one of the shared use mounters (component mounter 20), CPU 80a, if there is already a particular feeder that has completed supplying components at the other shared use mounter (component mounter 20), creates and sends an exchange instruction to exchange robot 50 to exchange (switch) those particular feeders.

Further, CPU 80a, if determining in S635 that there is a particular feeder waiting to be exchanged at the other shared use mounter, and determining in S640 that there is an empty slot 42 at the supply area 20A of the other shared use mounter, sets the particular feeder of the received feeder exchange request only as the exchange target (S650), then ends processing. Therefore, in a case in which supply of components has been completed from a particular feeder at one of the shared use mounters (component mounter 20), CPU 80a, if there is an empty slot 42 in the supply area 20A of the other shared use mounter (component mounter 20), creates and sends an exchange instruction to exchange robot 50 to transfer the particular feeder that has completed supplying components to the other shared use mounter. On the other hand, CPU 80a, if determining in S640 that there is not an empty slot in the supply area 20A of the other shared use mounter, sends an instruction to the shared use mounter (component mounter 20) that was the request origin of the feeder exchange request to wait for exchange of the particular feeder of the received feeder exchange request (S655), then ends processing. In this case, CPU 80a, next, when the particular feeder exchange request is received from the other shared use mounter, determines whether there are particular feeders waiting to be exchanged in S635, and performs processing to exchange those feeders with each other. Note that, CPU 80a, with regard to feeder 30 of component types other than the particular component types at the other shared use mounter, if there are feeders that have completed supplying components during mounting processing of one board S (feeders not being used in mounting processing of the one board), sets that feeder 30 that has completed supplying components and the particular feeder at the shared use mounter that was the sending origin of the received feeder exchange request as exchange targets. That is, the particular feeder exchange (switching) targets are not limited to other particular feeders, they may include normal feeders 30 that are not particular feeders. By doing this, it is possible to quickly transfer a particular feeder the subject of a feeder exchange request to the other shared use mounter.

Figure 21:
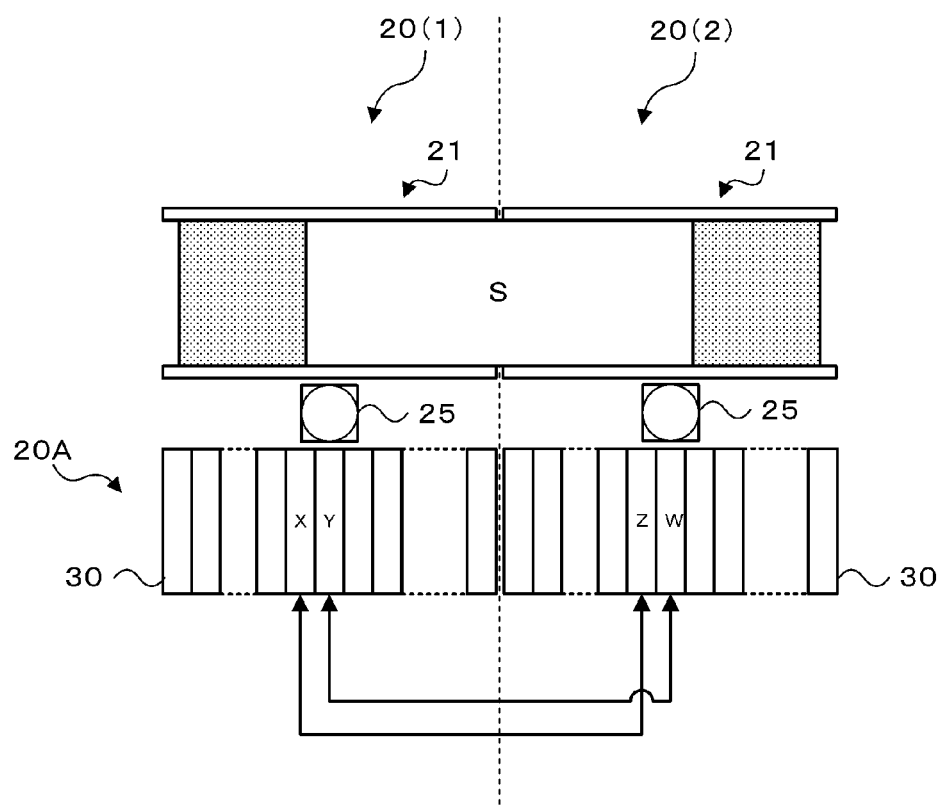
FIG. 21 illustrates a state of exchanging feeder 30 during mounting processing in a third embodiment.

FIG. 21 illustrates a state of exchanging feeder 30 during mounting processing in a third embodiment. In FIG. 21, mounting processing is performed by two adjacent component mounters 20, (1) and (2), on a single board S arranged straddling the two component mounters 20, each of the component mounters 20 (1) and (2) performing mounting in their respective possible mounting ranges. Component types X, Y, Z, and W are given as examples of component types for which mixed loading is not possible. That is, for these component types X, Y, Z, and W, components need to be mounted on the single board S having been supplied from the same feeder 30 (particular feeder). CPU 80a of management device 80 uses exchange robot 50 to alternately exchange the particular feeder of component types X and Y of the component mounter 20 (1) with the particular feeder of component types Z and W of the component mounter 20 (2), exchange being performed from the feeders that have completed supplying components. In FIG. 21, as an example, the particular feeder of component type X is exchanged with the particular feeder of component type Z, and the particular feeder of component type Y is exchanged with the particular feeder of component type W. Accordingly, it is possible to perform mounting processing by supplying components of the particular component types (component types X, Y, Z, and W) during mounting processing of a single board S while transferring the particular feeders between the two components mounter 20 (1) and (2). If such particular feeder transfer work is to be performed by an operator, the operator must judge the timing of the transfer work, meaning the workload would be great. In the present embodiment, because transfer of particular feeders between the component mounters 20 is performed by exchange robot 50, it is possible to perform transfer smoothly without increasing the workload. Note that, when mounting processing of the single board S is completed, the set particular feeders are switched at each of the shared use mounters. Therefore, CPU 80a of management device 80 or CPU 28a of mounting control device 28 may change the mounting order. For example, CPU 28a of mounting control device 28, when a set particular feeder is being switched from an initial setting target, may determine in S410 of component mounting processing of FIG. 10 that changing the mounting order is required, and may continue by changing the mounting order in S415. In this case, CPU 28a may change the mounting order such that mounting is performed from the particular component type of the particular feeder that was switched. Of course, CPU 80a of management device 80 may return the particular feeders to the initial setting state upon completion of mounting processing or during mounting processing of the single board S.

Correspondences between constituent elements of the third embodiment and constituent elements of the disclosure will be clarified here. CPU 80a of management device 80 that performs S200b of the initial setting related processing of FIG. 18 corresponds to an information acquiring section, CPU 80a that performs S260 and S262 of FIG. 18 corresponds to a supply origin determining section, and CPU 80a that performs S125 (non-component-run-out exchange related processing), S135, and S140 of the feeder exchange instruction sending processing of FIG. 7 after receiving the feeder exchange request of the particular feeder sent from component mounter 20 in S515b of the feeder exchange request sending processing of FIG. 19 corresponds to an instruction output section.

Component mounting system 10 of the third embodiment as described above performs mounting processing at multiple component mounters 20 arranged lined up along the conveyance direction of board S, and while mounting processing of a single type of board S is continuing, it is possible to use exchange robot 50 to transfer a feeder 30 set at any of the multiple component mounters 20 to and from each of the other component mounters 20. Further, component mounting system 10, for mounting processing of a single type of board S, in a case in which there is a particular component type that should be supplied from the same feeder 30 (a component type for which mixed loading is not allowed), performs mounting processing while using exchange robot 50 to transfer the one feeder of that particular component type between each of the component mounters 20. Therefore, component mounting system 10, in a case in which there is a particular component type that should be supplied from the same feeder, is able to perform mounting processing efficiently by transferring the feeder 30.

With the third embodiment, an example is given of performing mounting processing with respect to a single board S arranged straddling two component mounters 20 by supplying a component from the same feeder 30 (particular feeder), but the configuration is not limited to this. For a board S of a size that fits within a single component mounter 20, mounting processing may be performed by supplying components from the same feeder 30 (particular feeder). Further, two adjacent component mounters 20 that share the use of the same feeder 30 (particular feeder) are given as an example of shared use mounters, but the configuration is not limited to this, two non-adjacent component mounters 20 may be applied as shared use mounters, or three or more component mounters 20 that are adjacent or otherwise may be applied as shared use mounters. Note that, in a case in which there are multiple shared use mounters, all the particular feeders may be set as initial setting targets of the shared use mounter furthest upstream, or the particular feeders may be divided equally as initial setting targets of each of the shared use mounters.

With the third embodiment, as an example of a particular component type for which mixed loading is not allowed, components mounted within a single board S that are not allowed to be supplied from different feeders is given, but the configuration is not limited to this. For example, in a case in which different component types are mounted within a single board S as a set due to certain component characteristics, mounting processing can be performed while similarly transferring the same feeder 30 between each of the component mounters 20. Also, performing mounting processing while transferring the same feeder 30 between each of the component mounters 20 is not limited to a case in which mounting processing is performed of particular components (particular component types). If it is possible to use a feeder 30 across each component mounter 20, even in cases such as when the quantity of component supply units prepared is not the same as the quantity of component mounters, mounting processing can be performed efficiently. Alternatively, in a case when a feeder 30 runs out of components, mounting processing may be performed while transferring a feeder 30 of the same type of component as the component that ran out between each of the component mounters 20. An alternative embodiment is described below.

Figure 22:
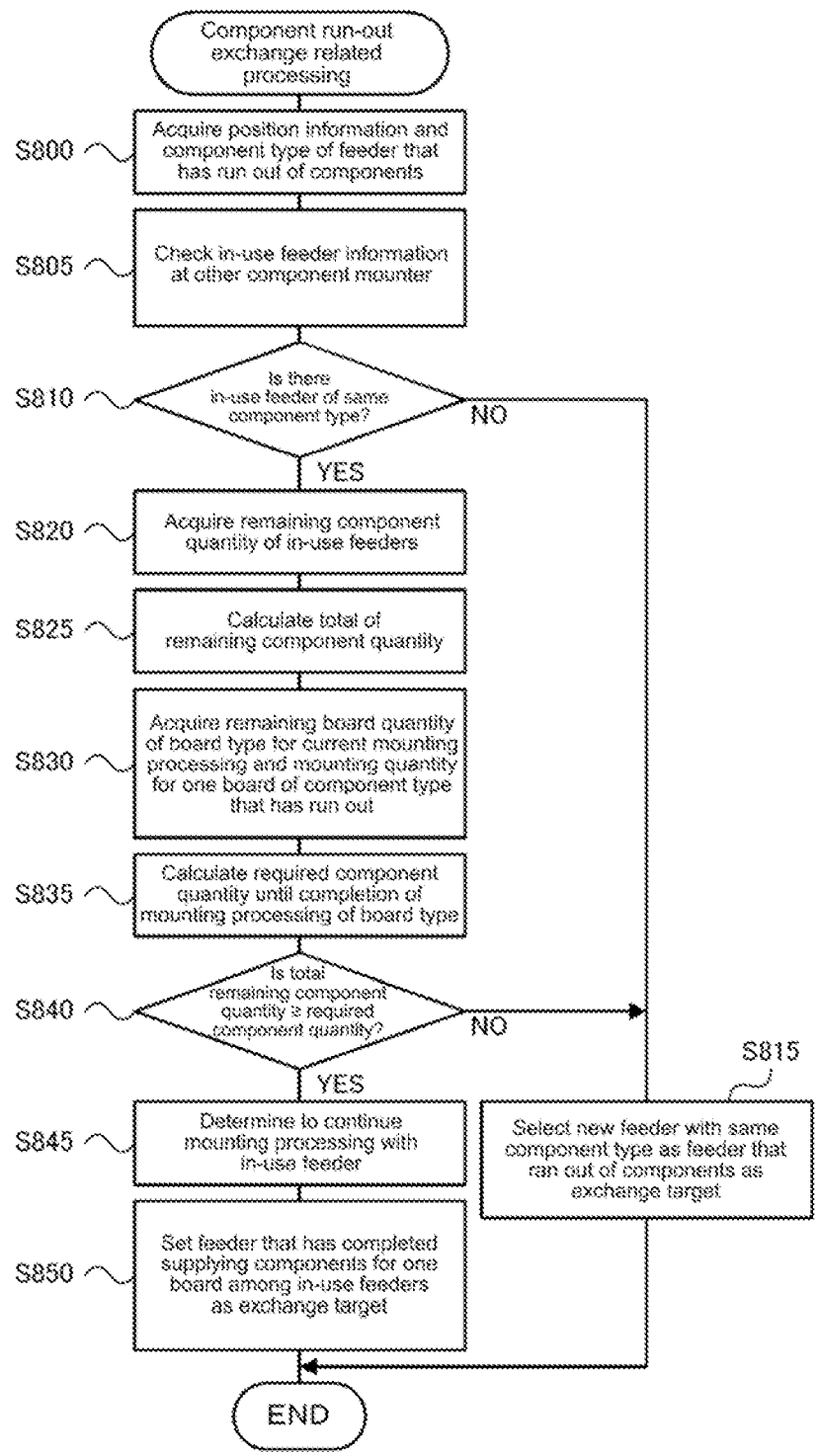
FIG. 22 is a flowchart of an alternative third embodiment showing exchange related processing for a component-run-out occurrence.

In this case, component-run-out exchange related processing of S120 of the feeder exchange instruction sending processing of FIG. 7 is performed based on the flowchart of FIG. 22. In this processing, CPU 80a of management computer 80, first, acquires component type and position information of the feeder 30 that has run out of components from the feeder exchange request. Next, CPU 80a checks information of feeders 30 in use based on the stock area information and supply area information of other component mounters 20 (S805), and determines whether there is a feeder 30 in use with the same component type as the feeder 30 for which components ran out (S810). CPU 80a, if determining that there is no feeder 30 in use with the same component type as the feeder 30 for which components ran out, sets a new feeder 30 with the same component type as the feeder 30 for which components ran out as an exchange target (S815), then ends processing. CPU 80a, in S815, sets the feeder for which components ran out and a new (not half used) feeder 30 of the same component type that is in stock area 20B as exchange targets. Note that, if there is not a feeder 30 of the same component type in stock area 20B, CPU 80a performs processing so as to notify an operator of that fact to instruct that the required feeder 30 be set, or such that exchange robot 50 is moved to stock area 20B of a different component mounter 20 and used to transport a new feeder 30 with the same component type.

Also, CPU 80a, if determining in S810 that there is a feeder 30 in use of the same component type as the feeder 30 that ran out of components in a different component mounter 20, acquires the remaining component quantity of those in-use feeders 30 (S820), and calculates the total remaining component quantity (S825). CPU 80a, if there is one feeder 30 that is in use of the same component type, acquires the component quantity of that feeder 30 as the total quantity in S825, and if there are multiple feeders 30 that are in use of the same component type, calculates the total of the remaining quantities of those multiple feeders 30. Continuing, CPU 80a acquires the remaining board quantity (production quantity) of the board type for which mounting processing is currently being performed, and the mounting quantity (supply quantity) per board of the component type that has run out (S830), and calculates the required component quantity until completion of mounting the board type on which mounting processing is currently being performed based on the remaining board quantity and the mounting quantity per board. Then, CPU 80a determines whether the total remaining component quantity calculated in S825 is equal to or greater than the required component quantity calculated in S835 (S840), and if determining that the total remaining component quantity is not equal to or greater than the required component quantity, sets the feeder 30 that ran out of components and a new feeder 30 of the same component type as exchange targets (S815), then ends processing. On the other hand, CPU 80a, if determining that the total remaining component quantity is equal to or greater than the required component quantity, decides to continue mounting processing by reusing feeders 30 that are in use (S845). Then, CPU 80a, among in-use feeders 30 (feeders 30 of the same component type that has run out) that are set on any of the component mounters 20, sets a feeder 30 that has completed supplying component during mounting processing of a single board S (S850), then ends processing. Note that, CPU 80a, in a case in which there is no feeder 30 that has completed supplying components, waits for one of the feeders 30 of the same component type that ran out to complete supplying components at one of the component mounters 20, and then sets that feeder 30 as an exchange target.

Figure 23:
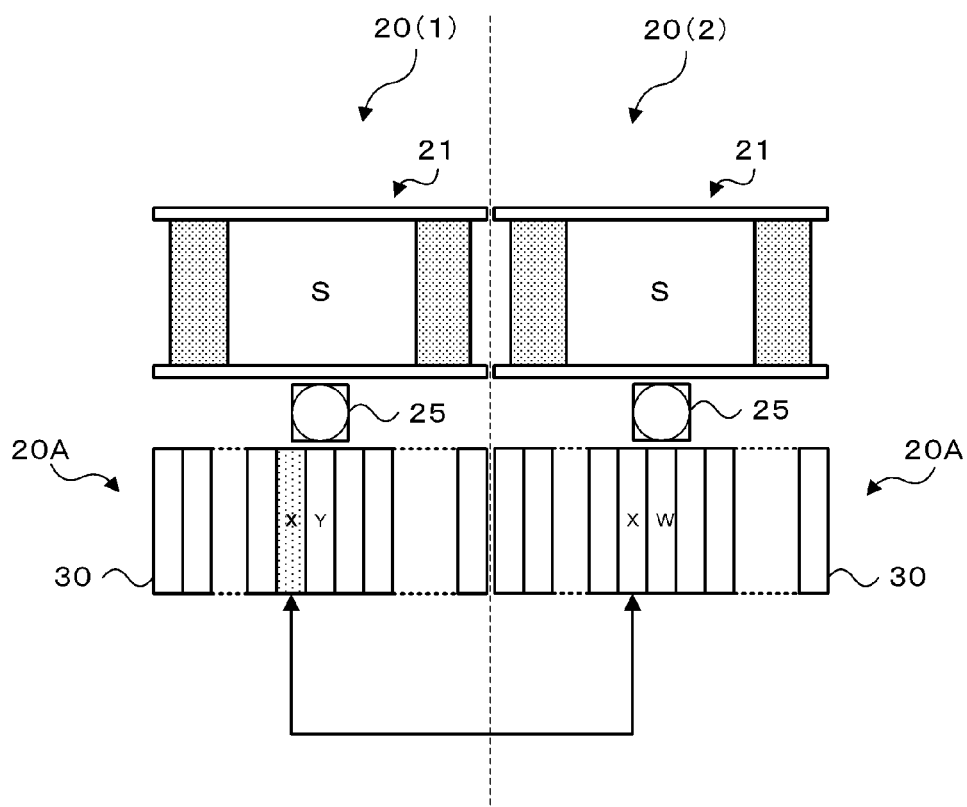
FIG. 23 illustrates a state of exchanging feeder 30 when a component has run out during mounting processing in an alternative third embodiment.

FIG. 23 illustrates a state of exchanging feeder 30 when a component has run out during mounting processing in an alternative third embodiment. In FIG. 23, mounting processing is respectively performed by two adjacent component mounters 20, (1) and (2), on the same type of board S, and a case is shown in which a feeder 30 of component type X set in supply area 20A of component mounter 20 (1) has run out. In this case, CPU 80a of management device 80 provisionally assumes that it has been determined that the remaining component quantity of component type X in component mounter 20 (2) is greater than the mounting quantity of component type X required at component mounter 20 (1) and (2) until mounting processing of the current board type is completed. Upon making such a determination, CPU 80a continues mounting processing of component type X at component mounter 20 (1) using a feeder of component type X of component mounter 20 (2) instead of a feeder of component type X of component mounter 20 (1) until mounting (supply) of component type X is completed at component mounter 20 (2). Further, when mounting (supply) of component type X is completed during mounting processing of the single board S at component mounter 20 (1), feeder 30 of component type X is removed from component mounter 20 (1) by exchange robot 50 and set again on component mounter 20 (2). Then, when mounting (supply) of component type X is completed during mounting processing of the single board S at component mounter 20 (2), feeder 30 of component type X is removed from component mounter 20 (2) by exchange robot 50 and set again on component mounter 20 (1). Accordingly, even if a feeder 30 runs out of components, mounting processing can be continued by efficiently using in-use feeders 30 without needing to use a new feeder 30.

In this manner, with the alternative third embodiment, when a feeder 30 runs out of components at any of the component mounters 20 during mounting processing, in a case in which the total remaining quantity at other feeders 30 set on all the component mounters 20 is greater than the required component quantity of the component type that ran out until mounting processing of that board S has been completed, mounting processing is performed while using exchange robot 50 to transfer those feeders 30 that have not run out of that component type between the component mounters 20. Thus, when a feeder 30 runs out of components, mounting processing can be continued without using a new feeder. Thus, an increase in the number of half-used feeders is prevented.

Fourth Embodiment

Figure 24:
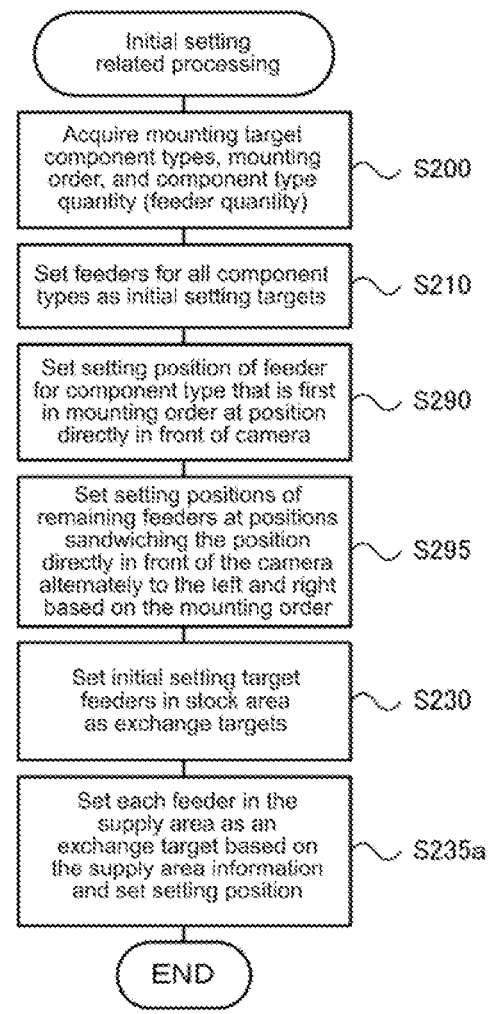
FIG. 24 is a flowchart showing initial setting related processing of a fourth embodiment.

A fourth embodiment of the present disclosure is described below. With the fourth embodiment, the initial setting related processing of FIG. 24 is performed instead of that of FIG. 8. With processing of FIG. 24, CPU 80a of management device 80, first, acquires the mounting target component types, mounting order of component types, and component type quantity (feeder quantity) (S200), and sets feeders 30 for all component types as initial setting targets (S210). Note that, in FIG. 24, the required feeder quantity does not exceed the upper limit loading quantity N, but there may be cases in which the required feeder quantity exceeds the upper limit loading quantity N. In this case, processing similar to the first embodiment, that is, processing of S215 to S225 of FIG. 8 may be performed.

Next, CPU 80a sets the setting position (the setting position in the component supply area 20A) of the feeder 30 of the 1st component type in the mounting order among the initial setting targets at the position directly in front of the camera (S290). The position directly in front of the camera, as described above, is the position inserted into the slot 42 facing component camera 25 and in the center in the X direction (left-right direction). Thus, when the feeder 30 is set directly in front of the camera, the movement distance of the head 22 from the component supply position of the feeder 30 to the position above component camera 25 is at its shortest. Continuing, CPU 80a sets the setting position of the remaining feeders 30 sandwiching the position directly in front of the camera alternately from the left and right sides based on the mounting order (S295). Thus, the later that feeders 30 are in the mounting order, the further they are arranged from the position directly in front of the camera. CPU 80a, after setting the setting position of feeders 30 for all the component types, sets initial setting target feeders 30 in the stock area from the stock area information of component mounter 20 as exchange targets (S230). Also, CPU 80a sets feeders 30 in supply area 20A as exchange targets based on the set setting positions and the supply area information of component mounter 20 (S235a), then ends processing.

With the fourth embodiment, CPU 28a of mounting control device 28 of component mounter 20 sends a feeder exchange request to management device 80 every time mounting processing of one component type is completed. Although feeder exchange request sending processing of the fourth embodiment is not shown, for example, it may be realized by omitting S505 from the feeder exchange request processing of FIG. 11. Also, in S515 of FIG. 11, processing of sending an exchange request to exchange with another feeder 30 before mounting may be performed.

Figure 25:
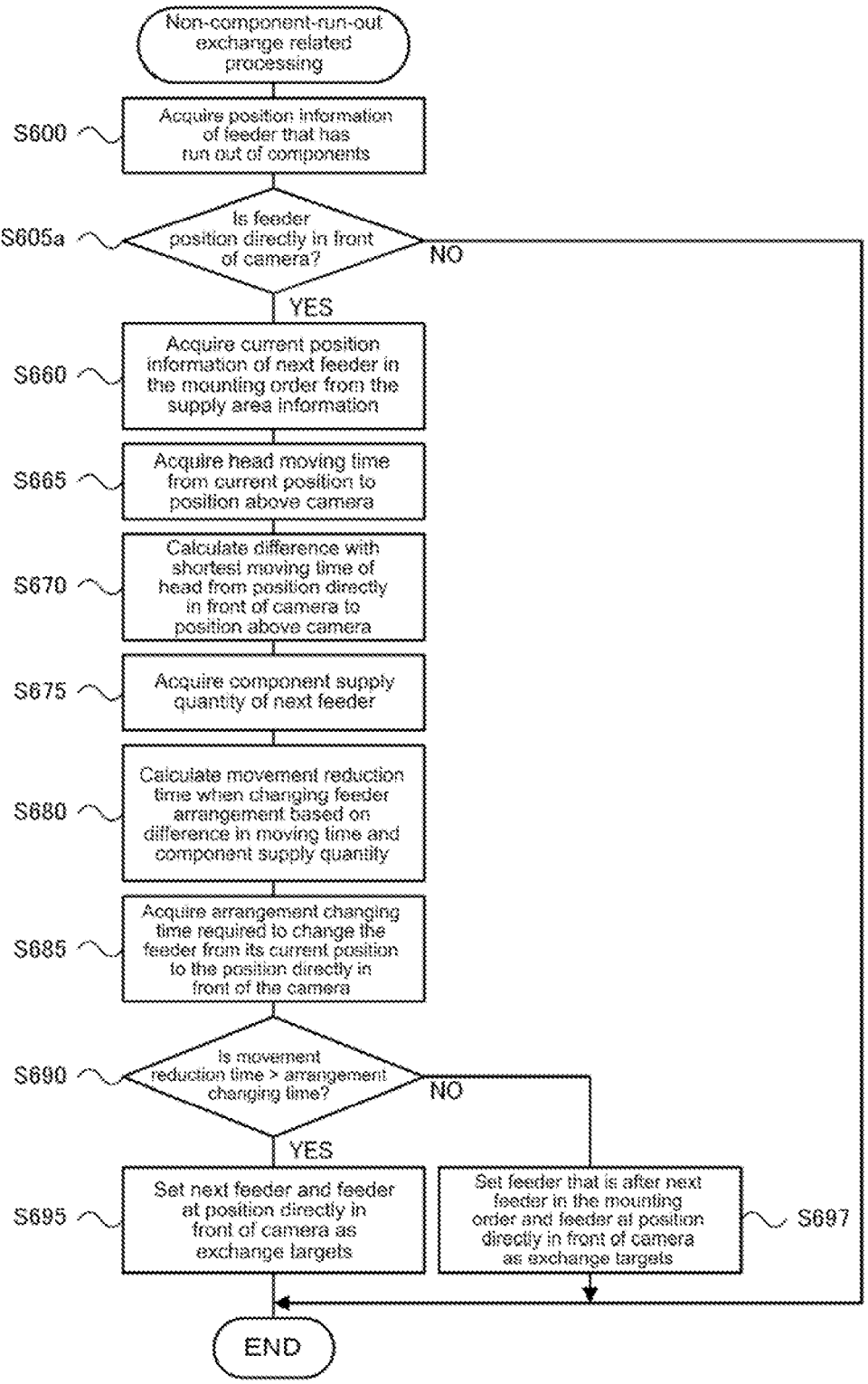
FIG. 25 is a flowchart of a fourth embodiment showing exchange related processing for a non-component-run-out occurrence.

With the fourth embodiment, non-component-run-out exchange related processing of FIG. 25 is performed instead of that of FIG. 12. In processing of FIG. 25, CPU 80a of management device 80, first, acquires position information of feeder 30 that has completed supplying components (S600), and determines whether the acquired position of the feeder 30 is directly in front of the camera (S605a). CPU 80a, if determining that the position of the feeder 30 is not directly in front of the camera, ends processing as is. On the other hand, CPU 80a, if determining that the position of the feeder 30 is directly in front of the camera, acquires the current position information of the feeder 30 of the next component type in the mounting order from the supply area information of component mounter 20 (S660). Then, CPU 80a acquires the movement time of head 22 from the feeder 30 current position (component supply position) to the position above component camera 25 (imaging position when the component is imaged) (S665), and calculates the difference between the acquired movement time of head 22 and the shortest movement time of head 22 from the position directly in front of the camera (component supply position) to the position above component camera 25 (S670). This difference is the portion by which the movement time is shorted for each movement of head 22 when head 22 picks up a component and moves above component camera 25. Here, the movement time from each component supply position at each slot 42 to the position above component camera 25 may be memorized in advance in HDD 80, and the movement time corresponding to the slot 42 in which the feeder 30 is set and the shortest movement time corresponding to the position directly in front of the camera may be read from HDD 80c by CPU 80a so as to be acquired. Alternatively, the movement time from each component supply position at each slot 42 to the position above component camera 25 may be memorized in advance in HDD 80, and the movement time corresponding to the slot 42 in which the feeder 30 is set and the shortest movement time corresponding to the position directly in front of the camera may be read from HDD 80c by CPU 80a, and that movement distance may be divided by the average moving speed of head 22 so as to acquire the movement time.

Continuing, CPU 80a acquires the quantity of components supplied (supply quantity, mounting quantity) by feeder 30 of the component type next in the mounting order (S675), and calculates the movement reduction time of head 22 that is shortening time in a case in which the position of the feeder 30 is changed to the position directly in front of the camera based on the component supply quantity and the movement time distance (S680). CPU 80a calculates the movement reduction time by multiplying the difference in the movement times by the supply quantity. Note that, head 22 is provided with multiple nozzles, and in a case when picking up multiple components and moving above component camera 25, the component pickup quantity is more than one for each movement. Therefore, CPU 80a may calculate the movement shortening distance by multiplying the difference in the movement times by a value that is the supply quantity divided by the pickup quantity. Also, CPU 80a acquires the arrangement changing time required for changing the arrangement of the position of feeder 30 from the current position to the position directly in front of the camera (S685). CPU 80a, as the arrangement changing time, may acquire a total time of the time for moving exchange robot 50 in the X direction and a time for exchange robot 50 to remove and insert the feeder 30 to and from the current position and the position directly in front of the camera. Note that, CPU 80a, if exchange robot 50 is in the middle of performing exchange work of another component mounter 20, may add the planned time required for that exchange to the total time. Alternatively, CPU 80a may acquire as the arrangement changing time a predetermined fixed time. Next, CPU 80a determines whether the movement reduction time calculated in S680 exceeds the arrangement changing time acquired in S685 (S690). That is, CPU 80a, for a case in which feeder 30 is changed from its current position to the position directly in front of the camera, determines whether the time shortening effect of reducing the movement time of head 22 exceeds the time required to change the arrangement of feeders 30. CPU 80a, if determining in S690 that the movement reduction time exceeds the arrangement changing time, sets the feeder 30 of the next component type and the feeder 30 positioned directly in front of the camera as exchange targets (S695), then ends processing. On the other hand, CPU 80a, if determining in S690 that the movement reduction time does not exceed the arrangement changing time, sets the feeder 30 of the component type after the next component type and the feeder 30 positioned directly in front of the camera as exchange targets (S697), then ends processing.

Figure 26:
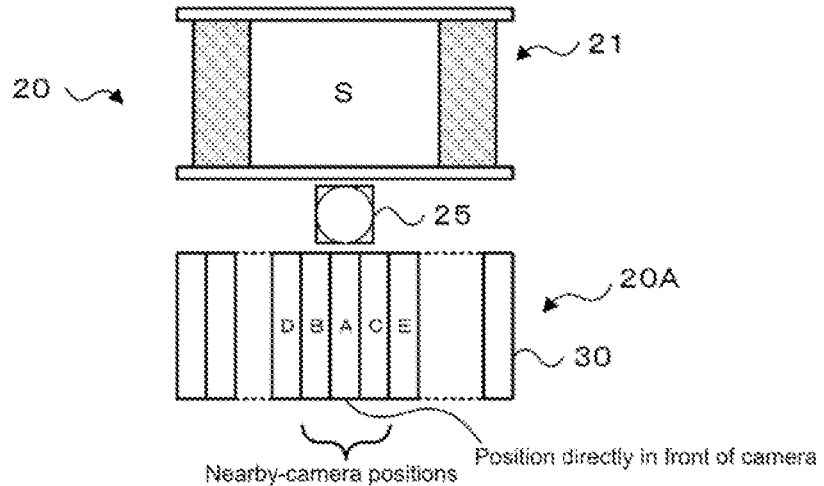
FIG. 26 illustrates a state of exchanging feeder 30 during mounting processing in a fourth embodiment.
Figure 26:
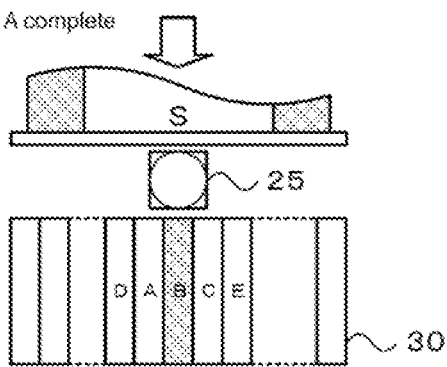
Figure 26:
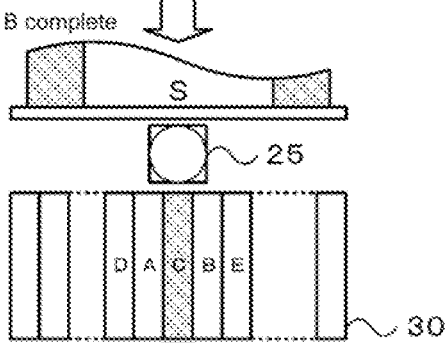
Figure 26:
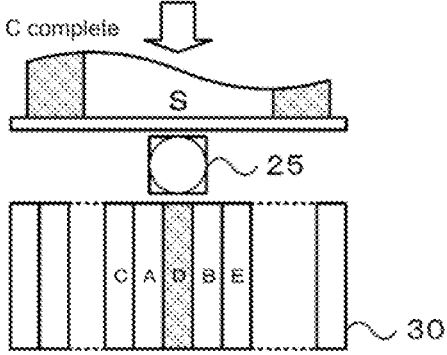

FIG. 26 illustrates a state of exchanging feeder 30 during mounting processing in a fourth embodiment. In FIG. 26, component mounter 20 mounts components in the order component type A, B, C, D, E and so on during mounting processing of a single board S. As shown in FIG. 26(*a*), in supply area 20A when starting mounting processing (at initial setting point), feeder 30 for component type A is set at the position directly in front of component camera 25, feeders 30 for component types B and C are set sandwiching component type A on the left and right, and feeders 30 for component types D and E are set further to the outside. Also, many of each type of component are to be mounted (for example, from several hundred to over one thousand). Therefore, CPU 80*a* determines that the movement reduction time due to changing the arrangement of feeders 30 for components types B to E from the initial positions to the position directly in front of the camera is larger than the arrangement changing time for the feeders 30. Component mounter 20, when completing supplying component type A, uses exchange robot 50 to change (switch) the positions of the feeders 30 for component type A and component type B, and as shown in FIG. 26(*b*), performs supply (mounting) of component type B with the feeder 30 for component type B set in the position directly in front of the camera. Subsequently, in a similar manner, component mounter 20, when completing supplying a given component type, sets the feeder 30 that supplies the next component type in the position directly in front of the camera, and then performs component supply (FIGS. 26[*c*] and 26[*d*]). Therefore, whichever component type is being mounted, it is possible to shorten the movement distance of head 22 from picking up the component with a nozzle at the component supply position to moving to a position above component camera 25. Further, because the position of the feeder 30 for the next component type is only changed in a case in which there is a shortening effect for the movement time of head 22, time loss due to exchange of feeders 30 is curtailed, and mounting efficiency is improved. Note that, CPU 80*a*, for example, in a case in which the movement reduction time due to moving the feeder 30 for component type D to the position directly in front of the camera is determined to not exceed the arrangement changing time, may perform mounting processing of component type D at the original position, and change the position of the feeder 30 of the subsequent component type E to the position directly in front of the camera instead of component type D.

When performing mounting processing in this manner, when mounting processing is completed for a single board S, the feeder 30 for the component type last in the mounting order is set at the position directly in front of the camera. Thus, component mounter 20 may start mounting processing of the next board S after changing the position of the feeder 30 for the component type last in the mounting order that is positioned directly in front of the camera and the position of the feeder 30 first in (at the head of) the mounting order. Alternatively, in a case in which the feeder 30 for the component type last in the mounting order is set at the position directly in front of the camera, CPU 28*a* may determine in S410 of the component mounting processing of FIG. 10 whether changing the mounting order is necessary, and then continue by changing the mounting order in S415. In this case, CPU 28*a* may change the mounting order to be reversed such that mounting is performed from the component type that was originally last in the mounting order positioned directly in front of the camera. Note that, if such feeder 30 exchange work is to be performed by an operator, the operator must judge the timing of when supply will be completed for each component type to perform the work, meaning the workload would be great. With the present embodiment, because each feeder 30 in supply area 20A is switched during mounting processing by exchange robot 50, there is no increase in workload, and feeders 30 can be changed to an optimal arrangement at an appropriate time.

Correspondences between constituent elements of the fourth embodiment and constituent elements of the disclosure will be clarified here. CPU 80*a* of management device 80 that performs S600, and S660 to S685 of the non-component-run-out exchange related processing of FIG. 25 corresponds to an information acquiring section, CPU 80*a* that performs S690 of FIG. 25 corresponds to an arrangement changing section, and CPU 80*a* that performs S125 (S695 of the non-component-run-out exchange related processing of FIG. 25), S135, and S140 of the feeder exchange instruction sending processing of FIG. 7 after receiving the feeder exchange request of the particular feeder sent from component mounter 20 in S515 of the feeder exchange request sending processing corresponds to an instruction output section.

With component mounting system 10 of the fourth embodiment described above, component mounting 20 performs mounting processing by moving head 22 above board S via a position (specified position) above component camera 25 after using head 22 to pick up a component supplied by feeder 30. Then, component mounting system 10 performs mounting processing while, among the feeders 30 that have completed supplying components during mounting processing of a single board S, with the feeder 30 set at the position for which the movement distance of head 22 from component pickup to above component camera 25 is the shortest as a target, using exchange robot 50 to change the arrangement of feeders 30 that have not completed supplying components. Therefore, because component mounting system 10 performs mounting processing while using exchange robot 50 to consecutively set feeders 30 to a position where the movement distance of head 22 is the shortest, mounting processing can be performed efficiently.

Also, CPU 80*a* of management device 80 acquires the movement reduction time that is the difference between the movement time of head 22 from the current position (first set position) of the feeder 30 of the component type next in the mounting order to the position above component camera 25, and the movement time of head 22 from the position directly in front of the camera (second set position) to the position above component camera 25. Then, CPU 80*a* acquires the arrangement changing time required to change the arrangement of the feeder 30 of the next component type, and in a case in which the movement reduction time exceeds the arrangement changing time, sends an exchange instruction to exchange robot 50 to change the arrangement of the feeder 30 of the next component type. Thus, in a case in which the movement reduction time of head 22 exceeds the arrangement changing time of the feeder 30, because the arrangement of the feeder 30 is changed, time loss due to changing the arrangement of feeder 30 is curtailed, and efficiency of mounting processing is appropriately improved. Note that, CPU 80*a*, with a case in which it is determined that the movement reduction exceeds the arrangement changing time, may change the arrangement of the feeder 30 of the next component type only if the time by which the movement reduction time exceeds the arrangement changing time (time difference) is equal to or great than a specified time.

With the fourth embodiment, the position to which to change to was the position directly in front of the camera (position directly in front of component camera 25), which is the position for which the movement distance of head 22 from component pickup to above component camera 25 is the shortest, but the position to which to change to is not limited to this. For example, the position to which to change to may be the position directly in front of the camera and a nearby-camera position that includes positions adjacent to the left and the right of that position (here, leading to three positions). In this case, in S605*a* of the non-component-run-out exchange related processing of FIG. 25, it may be determined whether the position of the feeder 30 that has completed supplying components is any of the nearby-camera positions. Also, in S670, S685, S695, and S697, instead of the position directly in front of the camera, the position of the feeder 30 that has completed supplying component out of the nearby-camera positions may be used. Also, as an arrangement changing destination of feeder 30, when there are multiple positions such as described above, the timing for determining whether CPU 80*a* of management device 80 is allowed to change the arrangement is not limited to timing when a feeder 30 has completed supplying components. For example, CPU 80*a* may change the arrangement of feeder 30 of the next component type after determining whether the feeder 30 of the next mounting order can be changed to another position of the multiple positions (a position different to the current supply position), while performing supply of components from the feeder 30 positioned at any of the multiple positions (that being the current supply position). Also, in this case, the time for performing supply of components from the feeder 30 at the current supply position, and the time for changing the arrangement of the feeder 30 of the next component type are compared, and in a case in which the time for performing supply of components exceeds the time for changing the arrangement, the arrangement of the feeder 30 of the next component type may be changed. Accordingly, it is possible to prevent waiting time that arises due to changing the arrangement of feeders 30, and to further improve the efficiency of mounting processing.

With the fourth embodiment, the arrangement of feeder 30 is changed such that the movement time of head 22 is shorter based on the component supply position (position at which head 22 picks up the component) and the position above component camera 25 (the specified position via which head 22 holding the component passes), but the configuration is not limited to this. For example, the arrangement of feeder 30 may be changed such that the movement time of head 22 is shorter based on the component supply position, the position above the component camera, and the component mounting position.

For example, using the position above component camera 25 (the specified position via which head 22 holding the component passes) as a reference, in a case in which the feeder 30 is on one side (for example, the left side) in the left-right direction (X direction) and the mounting position in on the other side (for example, the right side), head 22, after picking up the component at the supply position, can move to the mounting position passing through without stopping at the position over component camera 25 (at the specified position). In contrast, using the position above component camera 25 (the specified position via which head 22 holding the component passes) as a reference, in a case in which the feeder 30 is on one side (for example, the left side) in the left-right direction (X direction) and the mounting position in on the same side (for example, the left side), head 22, after picking up the component at the supply position, moves to the mounting position by changing its moving direction in the left-right direction by moving above component camera 25 and stopping above component camera 25. In this manner, depending on the positional relationship between the component supply position, the specified position (position above component camera 25) via which head 22 passes, and the component mounting position, head 22 may or may not be required to stop above component camera 25. If head 22 is not required to stop, because the mounting position can be reached more quickly, mounting efficiency is improved. Thus, CPU 80*a* of management device 80, for example, acquires the mounting position of each component for each component type, and determines whether for each component type many components are to be mounted in either a region on the right of or a region on the left of the board S with respect to component camera 25. Then, CPU 80*a*, in a case in which it is determined that the component to be mounted is a component type with many components in the right side region of board S, may set feeders 30 at positions to the left with respect to component camera 25 (the position directly in front of the camera). Also, CPU 80*a*, in a case in which it is determined that the component to be mounted is a component type with many components in the left side region of board S, may set feeders 30 at positions to the right with respect to component camera 25 (the position directly in front of the camera). That is, CPU 80*a* may set feeders 30 at positions opposite to a region determined to have many components mounted in it. In other words, movement efficiency is better if head 22 moves in a straight line from the component supply position to the component mounting position via the position (specified position) above component camera 25. Therefore, CPU 80*a* may set feeders 30 at positions such that the movement path of head 22 is close to a straight line based on the position (specified position) above component camera 25 and mounting positions (region) at which many components are to be mounted.

In the fourth embodiment, the arrangement of feeders 30 in supply area 20A is changed during mounting processing, but the configuration is not limited to this, and the arrangement of feeders removed from stock area 20B may be changed, or the arrangement of feeders 30 transported from outside by exchange robot 50 may be changed.

With the fourth embodiment, as well as feeders 30 set in supply area 20A, the embodiment may be applied to a component mounter 20 configured to be able to supply components from items such as a tray feeder that supplies components from a flat tray that houses components, or a bulk feeder on the head that directly supplies components (the configuration may be such that supply of components is possible from a component supply section different to a component supply unit). Also, management device 80, in a case in which the movement reduction time does not exceed the arrangement changing time, may send a mounting order changing instruction to component mounter 20, supply components from a tray feeder or a bulk feeder, and while that is occurring, change the arrangement of feeders 30. Also, the mounting order of component types may be changed, and the feeder 30 initial setting target positions may be set to make it easier for the movement reduction time to exceed the arrangement changing time. For example, if there is a feeder 30 for a component type with a large supply quantity for which it is better to change the arrangement, the initial setting positions may be set in advance such that the arrangement changing time is short.

Processing of this fourth embodiment can be performed by each component mounter 20, but if exchange timing occurs simultaneously at multiple component mounters 20, the work time (movement time) of exchange robot 50 will increase, in which case, it is more likely to be determined that the movement reduction time of head 22 does not exceed the arrangement changing time of feeders 30. Thus, management device 80 may perform processing of the fourth embodiment at a component mounter 20 selected from the multiple component mounters 20. For example, management device 80 may prioritize selecting a component mounter 20 for which the component quantity of each component type to be mounted on a single board S is great.

In this manner, in the first to fourth embodiments, during mounting processing of a single board S, because mounting processing is performed while using exchange robot 50 to exchange feeders with remaining housed components among the multiple feeders 30 set on component mounter 20 with different feeders, it is possible to perform mounting processing while efficiently exchanging feeders 30 during mounting processing of a single board S.

With the first to fourth embodiments, a feeder exchange request is sent from component mounter 20 to management device 80, CPU 80a of management device 80 determines which feeders 30 to exchange (exchange targets) based on the feeder exchange request, and sends an exchange instruction including a specification of the exchange target feeders 30 to exchange robot 50. Also, exchange control device 59 that has received that exchange instruction controls exchange robot 50 so as to perform exchange of feeders 30. However, the configuration is not limited to those above. For example, component mounter 20, when sending the feeder exchange request, may acquire required information such as the mounting order of each component type, or the board type on which mounting processing is to be performed in each lane and the mounting order of each component, and decide in advance how to exchange feeders 30 (exchange targets), and then send an exchange instruction including a specification of the exchange target feeders 30 to exchange robot 50. In this case, mounting control device 28 of component mounter 20 (CPU 28a) may acquire required information such as the state of feeders 30 set on another component mounter 20 via management device 80, or may acquire the required information directly from the other component mounter 20. Alternatively, the CPU of robot control device 59 that controls exchange robot 50 may decide how to exchange feeders 30 (exchange targets). That is, a portion or all of initial setting related processing, component-run-out exchange related processing, and non-component-run-out exchange related processing performed by CPU 80a of management device 80 may be performed by mounting control device 28 or exchange control device 59. Also, in this case, the configuration may be such that mounting control device 28 and robot control device 59 perform exchange of information directly.

With the first to fourth embodiments, component mounting system 10 is provided with component mounters 20 having two lanes, but none of the embodiments is limited to this configuration. For example, in the first, third, and fourth embodiments, component mounters 20 may have only one lane. Also, in the first, second, and fourth embodiments, it is not essential that component mounting system 10 is provided with multiple component mounters 20, the system may be applied to only a single component mounter 20.

Meanwhile, it goes without saying that the disclosure is not limited to the above-mentioned embodiment and various embodiments may be applied within the technical scope of the disclosure.

INDUSTRIAL APPLICABILITY

The present disclosure may be applied to the industrial field of component mounters and the like.

REFERENCE SIGNS LIST

10: component mounting system; 12: printer; 14: inspection machine; 18: X-axis rail; 20: component mounter; 20A: supply area; 20B: stock area; 21: board conveyance device; 22: head; 23: head moving mechanism; 24: mark camera; 25: component camera; 28: mounting control device; 28a: CPU; 28b: ROM; 28c: HDD; 28d: RAM; 30: feeder; 32: tape reel; 33: tape feeding mechanism; 34: positioning pin; 35: connector; 37: rail member; 39: feeder control device; 40: feeder table; 42: slot; 44: positioning hole; 45: connector; 50: exchange robot; 50A: upper section transfer area; 50B: lower section transfer area; 51: robot moving mechanism; 52a: X-axis motor; 52b: guide roller; 53: feeder transfer mechanism; 54: clamp section; 55: Y-axis slider; 55a: Y-axis motor; 55b: Y-axis guide rail; 56a: Z-axis motor; 56b: Z-axis guide rail; 57: encoder; 58: monitoring sensor; 59: robot control device; 80: management device; 80a: CPU; 80b: ROM; 80c: HDD; 80d: RAM; 82: display; 84: input device; S: board

The invention claimed is:

1. A mounting processing method performed at a component mounter, comprising:
    using the component mounter to perform mounting processing of mounting multiple types of components on a first board of multiple boards, the multiple types of components being supplied from multiple component supply units configured to house multiple components and be exchangeably set by a unit exchanging device;
    starting mounting processing on the first board in a state in which, from the multiple component supply units required for mounting processing on the first board, a portion of the multiple component supply units are set on the component mounter and a remaining portion of the component supply units are not set on the component mounter; and
    during the mounting processing of the first board, a component supply unit that has completed supplying the components during the mounting processing from among the portion of component supply units set on the component mounter with one of the component supply units of the remaining portion is exchanged by the unit exchanging device for one of the remaining portion of the component supply units that are not set on the component mounter.

2. The mounting processing method according to claim 1, further including:
    performing the mounting processing using a head to pick up the component supplied by the component supply unit and then moving the head above the board to a specified position, and
    during the mounting processing, from among the component supply units that have completed supplying the components, taking as a target for exchange the component supply unit set at a position for which a moving distance for the head from picking up the component to moving to the specified position is shorter than another component supply unit, and using the unit exchanging device to perform exchange of the target component supply unit with one of the remaining portion of the component supply units that are not set on the component mounter.

3. The component mounting method according to claim 1, further including during the mounting processing of the first board from among the component supply units set on the component mounter, using the unit exchanging device to change an arrangement of the component supply units that have completed supplying the components during the mounting processing, and the component supply units that have not completed supplying the components during the mounting processing.

4. The mounting processing method according to claim 3, further including performing the mounting processing using a head to pick up the component supplied by the component supply unit and then moving the head above the board to a specified position, and during the mounting processing, from among the component supply units that have completed supplying the components, taking as a target for exchange the component supply unit set at a position for which a moving distance for the head from picking up the component to moving to the specified position is shorter than another component supply unit, and using the unit exchanging device to change an arrangement of the component supply units that have not completed supplying the components during the mounting processing.

5. A mounting processing method performed at a component mounter, comprising:

using the component mounter to perform mounting processing of mounting multiple types of components on a board of multiple boards, the multiple types of components being supplied from multiple component supply units configured to house multiple components and be exchangeably set by a unit exchanging device;

consecutive mounting processing is performed by the component mounters on the boards that are conveyed in multiple lanes provided in parallel; and in a case in which a first type of the board on which mounting processing is being performed at a first lane among the multiple lanes and a second type of the board, different from the first type, for which mounting processing is being performed next at another of the lanes, performing exchange of the component supply unit that has finished supplying the components during the mounting processing of a single one of the boards of the first board type with the component supply unit required for the next mounting processing at the other lane while continuing the mounting processing at the first lane.

6. A mounting processing method performed at a component mounter comprising:

using the component mounter to perform mounting processing of mounting multiple types of components on a board of multiple boards, the multiple types of components being supplied from multiple component supply units configured to house multiple components and be exchangeably set by a unit exchanging device;

performing the mounting processing at the component mounters arranged along a conveyance direction of the board; and while continuing the mounting processing of the board of a same type, using the unit exchanging device to transfer the component supply unit set on one of the multiple component mounters to another of the component mounters.

7. The mounting processing method according to claim 6, wherein when components run out at the component supply unit of one type of the components during the mounting processing, in a case in which a required quantity of the one type of the components required to complete the mounting processing of the same type of the board is less than a total remaining quantity of components housed in other component supply units of the one type of components that are set on the multiple component mounters, the component supply unit for which the one type of components that has not run out is transferred by the unit exchanging device between the component mounters.

8. The mounting processing method according to claim 6, wherein during the mounting processing of boards of the same type, in a case in which there is a component type to be supplied from a single component supply unit, the single component supply unit of the component type is transferred between component mounters by the unit exchanging device.

9. A mounting system comprising:

a component mounter configured to perform mounting processing of mounting components on a board of multiple boards, the components being supplied from multiple component supply units that house multiple of the components;

a unit exchanging device configured to exchange the component supply units that are set on the component mounter; and an exchange control device configured to control the unit exchanging device, to exchange a component supply unit that has completed supplying the components with a remaining component supply unit from among the component supply units required for the mounting processing on the board of the multiple boards excluding a portion of the component supply units that are already set on the component supply units, based on a mounting order of the multiple types of the components during the mounting processing and information of the component supply units that have completed supplying component for the mounting processing of the board.

10. A mounting system comprising:

a component mounter configured to perform mounting processing of mounting components on a board, the components being supplied from multiple component supply units that house multiple of the components;

a unit exchanging device configured to exchange the component supply units that are set on the component mounter; and an exchange control device configured to control the unit exchanging device to change an arrangement of the component supply units that have completed supplying the components during the mounting processing and the component supply units that have not completed supplying the components during the mounting processing during the mounting of the board based on a mounting order of multiple types of the components during the mounting processing and information of the component supply units that have completed supplying component for the mounting processing.

11. A mounting system comprising:
a component mounter configured to perform mounting processing of mounting components on a board of multiple types of boards, the components being supplied from multiple component supply units that house multiple of the components, the component mounter performing consecutive mounting processing on the boards that are conveyed in multiple lanes provided in parallel;
a unit exchanging device configured to exchange the component supply units that are set on the component mounter; and
an exchange control device configured to control the unit exchanging device, in a case in which a first type of the board on which mounting processing is being performed at a first lane among the multiple lanes, and another type of the board for which mounting processing is to be performed next at another of the lanes, are different, while continuing the mounting processing of the board of the same type at the first lane, based on a mounting order of multiple types of the components at the first lane and the other lane and information of the component supply units that have completed supplying component for the mounting processing, to perform control such that the unit exchanging device exchanges the component supply unit that has completed supplying the components with the component supply unit required for the next mounting processing in the other lane.

12. A mounting system comprising:
multiple component mounters arranged lined up in a conveyance direction of a board of multiple boards, a component mounter of the multiple component mounters configured to perform mounting processing of mounting components on the board, the components being supplied from multiple component supply units that house multiple of the components;
a unit exchanging device configured to exchange the component supply units that are set on the component mounter; and
an exchange control device configured to control the unit exchanging device such that, while continuing mounting processing of a same type of the board, based on information of the component supply units that have completed supplying the components during the mounting processing of one board of the same board type at the multiple component mounters, the unit exchanging device transfers the component supply units set on the multiple component mounters between the component mounters.

13. An exchange control device for performing control of a unit exchanging device that exchanges component supply units housing multiple components on a component mounter that performs mounting processing of mounting multiple types of the components supplied by multiple of the component supply units, the exchange control device comprising:
an information acquiring section configured to acquire various information including a mounting order of the multiple types of components during mounting processing and information of component supply units that have completed supplying the components during the mounting processing, and
an instruction output section configured to output an instruction to the unit exchanging device to exchange, from among the multiple component supply units set on the component mounter, the component supply unit that has completed supplying the components with a different one of the component supply units later in the mounting order of one board of multiple boards than the component supply unit that has completed supplying the components, based on the mounting order of the multiple types of the components on the one board and the information of the component supply units that have completed supplying the components.

14. The exchange control device according to claim 13, wherein
the unit exchanging device is configured to perform exchange of the component supply units on the component mounter that performs mounting processing on the boards that are conveyed in multiple lanes provided in parallel,
the information acquiring section acquires information of the type of each of the panels on which mounting processing is to be performed in the multiple lanes, and
further included is a board type determining section configured to determine whether, in a case in which switching is performed from mounting processing of a first one of the lanes among the multiple lanes to mounting processing of another of the lanes, the type of the board in the first one of the lanes and the type of the board in the other of the lanes are different, and
the instruction output section is configured to, in a case in which the board type determining section determines that the type of the board in the first one of the lanes and the type of the board in the other of the lanes are different, during mounting processing of the board in the first one of the lanes, exchange the component supply unit that has finished supplying the components during the mounting processing of the one board of the same board type with the component supply unit required for the next mounting processing in the other lane.

15. The exchange control device according to claim 13, wherein
the unit exchanging device is configured to exchange the component supply devices at multiple of the component mounters arranged lined up in a conveyance direction of the board,
the information acquiring section is configured to, when components run out at the component supply unit of one type of the components during mounting processing, acquire a required component quantity that is a required quantity of the component type until mounting processing of the same type of the board is complete, and a remaining component quantity that is a quantity of remaining components housed in different component supply units of the same component type that are set on the multiple component mounters,
further included is a component quantity determining section configured to determine whether the remaining component quantity is larger than the required component quantity, and
wherein the instruction output section is configured to, in a case in which the component quantity determining section determines that the remaining component quantity is larger than the required component quantity, output instructions to the unit exchanging device so as to exchange the component supply unit for which components have run out with the different component supply unit of the same component type that has not run out of components.

16. The exchange control device according to claim 13, further including a supply source determining section configured to determine whether there is a component type for which a supply source of the component should be the same component supply unit during mounting processing of the same type of the board, wherein the instruction output section is configured to, in a case in which the supply source determining section determines that there is a component type for which a supply source of the component should be the same component supply unit during mounting processing of the same type of the board, when supplying of components is completed from one component supply unit of the component type at the component mounter, output an instruction to the unit changing device so as to remove the one component supply unit from the component mounter and set the one component supply unit on a different one of the component mounters.

17. The exchange control device according to claim 13, wherein the unit exchanging device is configured to exchange the component supply units at the component mounter that performs mounting processing by using a head to pick up a component supplied by a component supply device, and then moving the head above the board via a specified position, and the information acquiring section is configured to, based on a first set position at which the component supply units that are to be determined are set, and a second set position closer to the specified position than the first set position, acquire a movement reduction time that is a difference between a moving time of the head from the component supply position at the component supply unit positioned at the first set position and a moving time of the head from the component supply position at the component supply unit positioned at the second set position, and an arrangement changing time that is a time required to change an arrangement of the component supply unit, further including an arrangement changing determining section configured to determine whether to change the arrangement of the component supply units that were targets for the determining, based on the mounting order, the reduction time, and the arrangement changing time, and wherein the instruction output section is configured to, in a case in which the arrangement changing determining section determines to change the arrangement, output instructions to the unit exchanging device such that when supplying of the components by the component supply units set at the second set position is completed, the arrangement of the component supply unit for which supplying of the components is completed and the component supply unit set at the first set position is changed.

18. The exchange control device according to claim 13, wherein the information acquiring section is configured to acquire information of a required unit quantity of the multiple component supply units that are required for mounting processing of the one board, further included are a unit quantity determining section configured to determine whether the required unit quantity exceeds a maximum unit quantity indicating how many units can be set on the component mounter, and a set contents deciding section configured to decide setting contents of the component supply unit before being set on the component mounter in a case in which the unit quantity determining section determines that the required unit quantity exceeds the maximum unit quantity, and wherein the setting contents deciding section, based on the mounting order, is configured to decide, from among the multiple component supply units required for mounting processing of the one board, a portion of the component supply units that should be set on the component mounter when the mounting processing is started, and to decide a setting order of the remaining component supply units excluding the portion of the component supply units that should be set when mounting processing is started, and the instruction output section is configured to, before mounting processing of the one board is started, output an instruction to the unit exchanging device to set the portion of the component supply units on the component mounter, and during the mounting processing, to exchange the component supply unit that has completed supplying the components during the mounting processing with the component supply unit that should be set next based on the setting order.

19. A component mounter, comprising:

multiple component supply units configured to house multiple components and be exchangeably set;

a unit exchanging device configured to exchange the component supply units with each other; and an exchange control device configured to send an exchange request to the unit exchanging device to perform exchange of a component supply unit that has completed supplying the components with a component supply unit that has not completed supplying the components during mounting processing of a board of multiple boards, based on a mounting order of the multiple components during the mounting processing of the board, and information of the component supply unit that has completed supplying the components during the mounting processing.

20. A component mounter, comprising:

multiple component supply units configured to house multiple components and be exchangeably set;

a unit exchanging device configured to exchange the component supply units with each other; and, an exchange control device configured to send an exchange request to the unit exchanging device to perform exchange of a component supply unit that has completed supplying the components with a component supply unit required for a next mounting processing in another lane during mounting processing of a board of multiple boards, based on a type of the boards on which mounting processing is to be performed at multiple lanes, a mounting order of the multiple components during the mounting processing for each type of the boards, and information of the component supply unit that has completed supplying the components during the mounting processing at one of the lanes among the multiple lanes.

* * * * *